(12) United States Patent
Lee

(10) Patent No.: US 11,804,429 B2
(45) Date of Patent: Oct. 31, 2023

(54) SEMICONDUCTOR MEMORY DEVICE AND ERASING METHOD OF THE SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/083,206

(22) Filed: Dec. 16, 2022

(65) Prior Publication Data

US 2023/0120166 A1 Apr. 20, 2023

Related U.S. Application Data

(63) Continuation of application No. 17/030,013, filed on Sep. 23, 2020, now Pat. No. 11,562,956.

(30) Foreign Application Priority Data

Apr. 17, 2020 (KR) .................. 10-2020-0046886

(51) Int. Cl.
| | |
|---|---|
| H10B 41/27 | (2023.01) |
| H01L 23/522 | (2006.01) |
| H01L 21/768 | (2006.01) |
| G11C 16/14 | (2006.01) |
| H01L 25/065 | (2023.01) |
| H01L 25/18 | (2023.01) |
| H01L 25/00 | (2006.01) |
| G11C 16/04 | (2006.01) |
| H10B 41/35 | (2023.01) |
| H10B 43/27 | (2023.01) |
| H10B 43/35 | (2023.01) |
| H10B 43/40 | (2023.01) |

(52) U.S. Cl.
CPC ...... *H01L 23/5226* (2013.01); *G11C 16/0483* (2013.01); *G11C 16/14* (2013.01); *H01L 21/76802* (2013.01); *H01L 21/76877* (2013.01); *H01L 25/0657* (2013.01); *H01L 25/18* (2013.01); *H01L 25/50* (2013.01); *H10B 41/27* (2023.02); *H10B 41/35* (2023.02); *H10B 43/27* (2023.02); *H10B 43/35* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 2015/0155047 A1* | 6/2015 | Kim | G11C 16/107 365/185.29 |
| 2021/0225449 A1 | 7/2021 | Sakaguchi et al. | |

FOREIGN PATENT DOCUMENTS

| | | |
|---|---|---|
| KR | 1020190125739 A | 11/2019 |
| KR | 1020200033067 A | 3/2020 |

* cited by examiner

*Primary Examiner* — Hsien Ming Lee
(74) *Attorney, Agent, or Firm* — WILLIAM PARK & ASSOCIATES LTD.

(57) ABSTRACT

There are provided a semiconductor memory device and an erasing method of the semiconductor memory device. The semiconductor memory device includes: a plurality of word lines stacked between a source conductive pattern and a bit line; at least two drain select lines disposed between the plurality word lines and the bit line, the at least two drain select lines being spaced apart from each other in an extending direction of the bit line; and an erase control line disposed between the at least two drain select lines and the plurality of word lines.

10 Claims, 20 Drawing Sheets

SEMICONDUCTOR MEMORY DEVICE AND ERASING METHOD OF THE SEMICONDUCTOR MEMORY DEVICE

CROSS-REFERENCE TO RELATED APPLICATION

The present application is a continuation application of U.S. patent application Ser. No. 17/030,013, filed on Sep. 23, 2020, and claims priority under 35 U.S.C. § 119(a) to Korean patent application number 10-2020-0046886, filed on Apr. 17, 2020, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device and an erasing method of the three-dimensional semiconductor memory device.

2. Related Art

A semiconductor memory device includes memory cells capable of storing data. A three-dimensional semiconductor memory device includes three-dimensionally arranged memory cells, so that an area occupied by memory cells per unit area of a substrate can be reduced.

The three-dimensional semiconductor memory device may erase data stored in a memory cell through a Gate Induced Drain Leakage (GIDL) erase operation of generating holes by using a GIDL current.

SUMMARY

In accordance with an aspect of the present disclosure, there may be provided a semiconductor memory device including: a plurality of word lines stacked between a source conductive pattern and a bit line; at least two drain select lines disposed between the plurality word lines and the bit line, the at least two drain select lines being spaced apart from each other in an extending direction of the bit line; and an erase control line disposed between the at least two drain select lines and the plurality of word lines.

In accordance with another aspect of the present disclosure, there may be provided a semiconductor memory device including: a source conductive pattern; a first channel structure and a second channel structure, which are connected to the source conductive pattern; a first drain-side channel structure connected to the first channel structure; a second drain-side channel structure connected to the second channel structure; a first drain select line surrounding the first drain-side channel structure; a second drain select line surrounding the second drain-side channel structure; a word line disposed between the source conductive pattern and the first drain select line, the word line extending to surround the first channel structure and the second channel structure; and an erase control line disposed between the word line and the first drain select line, the erase control line extending to surround the first channel structure and the second channel structure.

In accordance with still another aspect of the present disclosure, there may be provided a method for erasing a semiconductor memory device, the method including: increasing a potential of a source conductive pattern by a potential of a bit line; generating hot holes in an erase control transistor of a cell string and introducing the hot holes to a channel of a plurality of memory cells, wherein the cell string includes a source select transistor connected to the source conductive pattern, a drain select transistor connected to the bit line, the plurality of memory cells connected in series between the source select transistor and the drain select transistor, and the erase control transistor connected between the plurality of memory cells and the drain select transistor; and erasing data stored in the plurality of memory cells by applying an erase voltage to the bit line and applying an erase permission voltage to a plurality of word lines connected to the plurality of memory cells.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms and should not be construed as limited to the embodiments set forth herein.

Hereinafter, the terms 'first' and 'second' are used to distinguish one component from another component. For example, a first component may be referred to as a second component without departing from a scope in accordance with the concept of the present disclosure and similarly, a second component may be referred to as a first component.

Embodiments provide a semiconductor memory device capable of improving operational reliability, and an erasing method of the semiconductor memory device.

Figure 1:
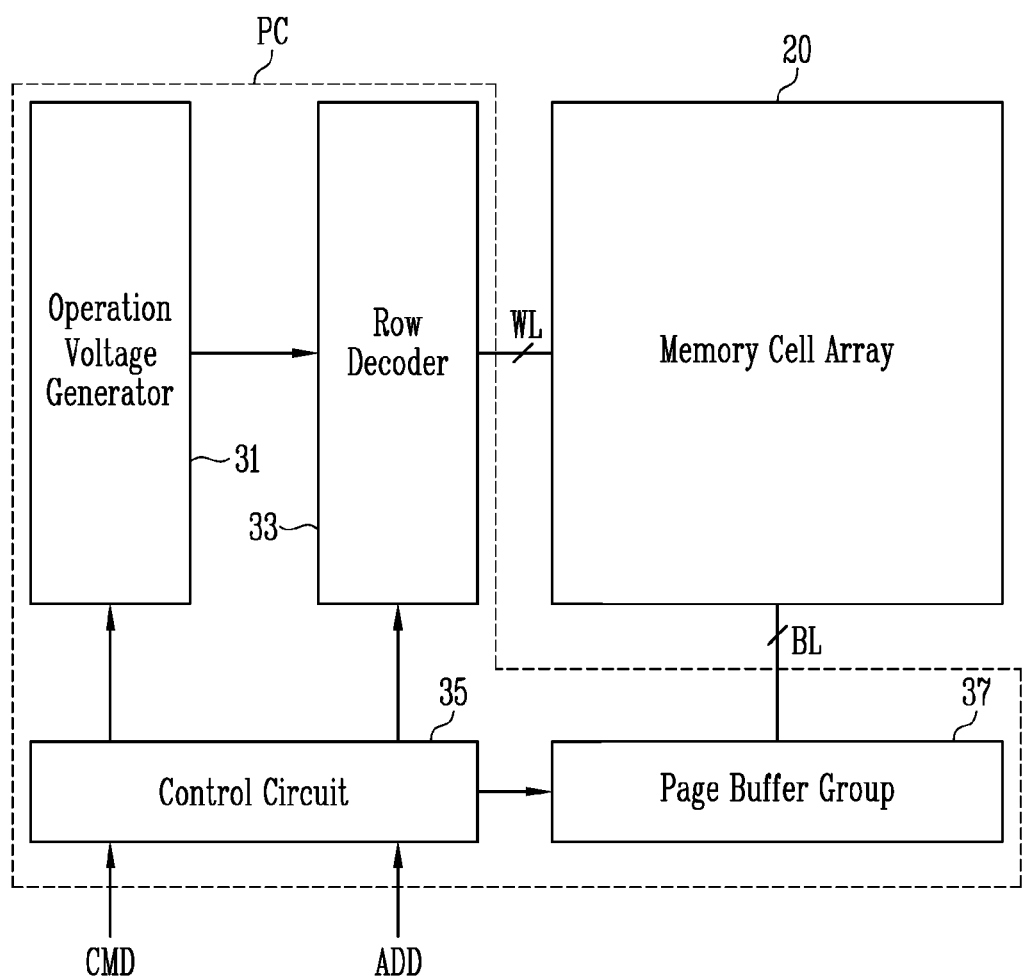
FIG. 1 is a block diagram illustrating a semiconductor memory device in accordance with an embodiment of the present disclosure.

FIG. 1 is a block diagram illustrating a semiconductor memory device 10 in accordance with an embodiment of the present disclosure.

Referring to FIG. 1, the semiconductor memory device 10 may include a peripheral circuit PC and a memory cell array 20.

The peripheral circuit PC may control a program operation for storing data in the memory cell array 20, a read operation for outputting data stored in the memory cell array 20, and an erase operation for erasing data stored in the memory cell array 20.

In an embodiment, the peripheral circuit PC may include an operation voltage generator 31, a row decoder 33, a control circuit 35, and a page buffer group 37.

The memory cell array 20 may include a plurality of memory blocks. The memory cell array 20 may be connected to the row decoder 33 through word lines WL, and be connected to the page buffer group 37 through bit lines BL.

The control circuit 35 may control the peripheral circuit PC in response to a command CMD and an address ADD.

The operation voltage generator 31 may generate various operation voltages used for a program operation, a read operation, and an erase operation under the control of the control circuit 35. The operation voltages may include a pre-erase voltage, an erase voltage, a ground voltage, a program voltage, a verify voltage, a pass voltage, a read voltage, and the like.

The row decoder 33 may select a memory block under the control of the control circuit 35. The row decoder 33 may apply operation voltages to word lines WL coupled to the selected memory block.

The page buffer group 37 may be connected to the memory cell array 20 through the bit lines BL. The page buffer group 37 may temporarily store data received from an input/output circuit (not shown) in a program operation under the control of the control circuit 35. The page buffer group 37 may sense a voltage or current of the bit lines BL in a read operation or verify operation under the control of the control circuit 35. The page buffer group 37 may select the bit lines BL under the control of the control circuit 35.

Structurally, the memory cell array 20 may be disposed on the peripheral circuit PC. The memory cell array 20 may overlap with a portion of the peripheral circuit PC.

Figure 2:
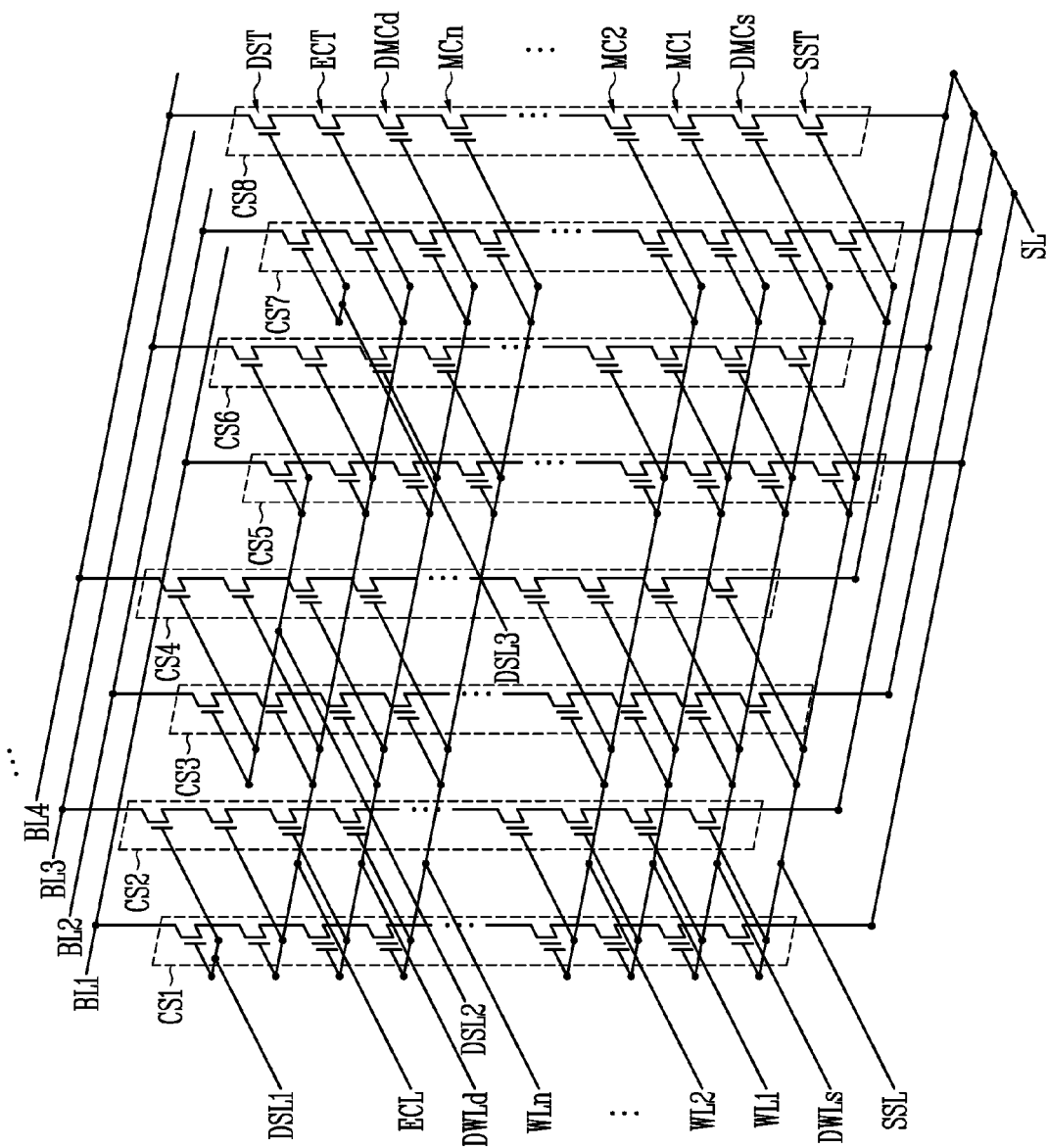
FIG. 2 is a circuit diagram illustrating a memory cell array in accordance with an embodiment of the present disclosure.

FIG. 2 is a circuit diagram illustrating a memory cell array in accordance with an embodiment of the present disclosure.

Referring to FIG. 2, the memory cell array may include a plurality of cell strings CS1 to CS8 commonly connected to each of a source conductive pattern SL, a plurality of word lines WL1 to WLn, and an erase control line ECL. The cell strings CS1 to CS8 may be connected to a plurality of bit lines BL1 to BL4. The cell strings CS1 to CS8 may be divided into a plurality of column groups respectively connected to the bit lines BL1 to BL4. The cell strings CS1 to CS8 may be divided into a plurality of row groups respectively connected to at least two drain select lines DSL1, DSL2, and DSL3. Cell strings of the same column group, which are connected to the same word line and the same erase control line ECL, may be independently controlled by different drain select lines. In addition, cell strings of the same row group, which are connected to the same drain select line, may be independently controlled by different bit lines.

In an embodiment, the memory cell array may include first to fourth bit lines BL1 to BL4 which are consecutively arranged. The first to fourth bit lines BL1 to BL4 may be connected to first to eighth cell strings CS1 to CS8 which are arrange in zigzag. In an embodiment, a first column group connected to the first bit line BL1 may include the first cell string CS1 and the fifth cell string CS5, a second column group connected to the second bit line BL2 may include the third cell string CS3 and the seventh cell string CS7, a third column group connected to the third bit line BL3 may include the second cell string CS2 and the sixth cell string CS6, and a fourth column group connected to the fourth bit line BL4 may include the fourth cell string C54 and the eighth cell string CS8.

The first cell string CS1 of the first column group and the second cell string CS2 of the third column group may be connected to a first drain select line DSL1, and be included in a first row group. The third cell string CS3 of the second column group, the fourth cell string CS4 of the fourth column group, the fifth cell string CS5 of the first column group, and the sixth cell string CS6 of the third column group may be connected to a second drain select line DSL2, and be included in a second row group. The seventh cell string CS7 of the second column group and the eighth cell string CS8 of the fourth column group may be connected to a third drain select line DSL3, and be included in a third row group.

In the above-described embodiment, the first cell string CS1 and the fifth cell string CS5 of the first column group may be independently controlled respectively by the first drain select line DSL1 and the second drain select line DSL2. Similarly, the third cell string CS3 and the seventh cell string CS7 of the second column group, the second cell string CS2 and the sixth cell string CS6 of the third column group, and the fourth cell string CS4 and the eighth cell string CS8 of the fourth column group may be independently controlled respectively by the first to third drain select lines DSL1 to DSL3.

In the above-described embodiment, the first cell string CS1 and the second cell string CS2 of the first row group may be independently controlled respectively by the first bit line BL1 and the third bit line BL3. Similarly, the third cell string CS3, the fourth cell string CS4, the fifth cell string CS5, and the sixth cell string CS6 of the second row group may be independently controlled respectively by the first to fourth bit lines BL1 to BL4, and the seventh cell string CS7 and the eighth cell string CS8 of the third row group may be independently controlled by the second bit line BL2 and the fourth bit line BL4.

However, the present disclosure is not limited to the above-described embodiment, and the number of cell strings respectively connected to the bit lines BL1 to BL4 to constitute the same column group and the number of cell strings respectively connected to the drain select lines DSL1 to DSL3 to constitute the same row group may be variously changed.

Each of the cell strings CS1 to CS8 may include at least one source select transistor SST connected to the source conductive pattern SL, at least one drain select transistor DST connected to a bit line, a plurality of memory cells MC1 to MCn connected in series between the source select transistor SST and the drain select transistor DST, and an erase control transistor ECT connected between the plurality of memory cells MC1 to MCn and the drain select transistor DST. Each of the cell strings CS1 to CS8 may further include at least one of a drain-side dummy memory cell DMCd and a source-side dummy memory cell DMCs. The drain-side dummy memory cell DMCd may be connected between the erase control transistor ECT and the plurality of memory cells MC1 to MCn. The source-side dummy memory cell DMCs may be connected between the source select transistor SST and the plurality of memory cells MC1 to MCn.

Gates of the plurality of memory cells MC1 to MCn may be respectively connected to the plurality of word lines WL1 to WLn which are stacked to be spaced apart from each other. The plurality of word lines WL1 to WLn may be disposed between a source select line SSL and the at least two drain select lines DSL1 to DSL3. The at least two drain select lines DSL1 to DSL3 may be spaced apart from each other at the same level.

A gate of the source select transistor SST may be connected to the source select line SSL. A gate of the drain select transistor DST may be connected to a corresponding drain select line among the drain select lines DSL1 to DSL3.

The erase control line ECL may be disposed between the plurality of word lines WL1 to WLn and the at least two drain select lines DSL1 to DSL3. The erase control line ECL may be connected to a gate of the erase control transistor ECT.

A gate of the source-side dummy memory cell DMCs may be connected to a source-side dummy word line DWLs, and a gate of the drain-side dummy memory cell DMCd may be connected to a drain-side dummy word line DWLd. The source-side dummy word line DWLs may be disposed between the plurality of word lines WL1 to WLn and the source select line SSL, and the drain-side dummy word line DWLd may be disposed between the plurality of word lines WL1 to WLn and the erase control line ECL.

The source conductive pattern SL may be connected to a source of the source select transistor SST.

Each of the bit lines BL1 to BL4 may be connected to a drain of a corresponding drain select transistor DST.

The plurality of cell strings CS1 to CS8 commonly connected to each of the plurality of word lines WL1 to WLn and the erase control line ECL may be commonly connected to each of the source select line SSL, the source-side dummy word line DWLs, and the drain-side dummy word line DWLd.

An erase operation of the semiconductor memory device in accordance with an embodiment of the present disclosure may be performed by generating a Gate Induced Drain Leakage (GIDL) current through a voltage applied to the bit lines BL1 to BL4.

Figure 3:
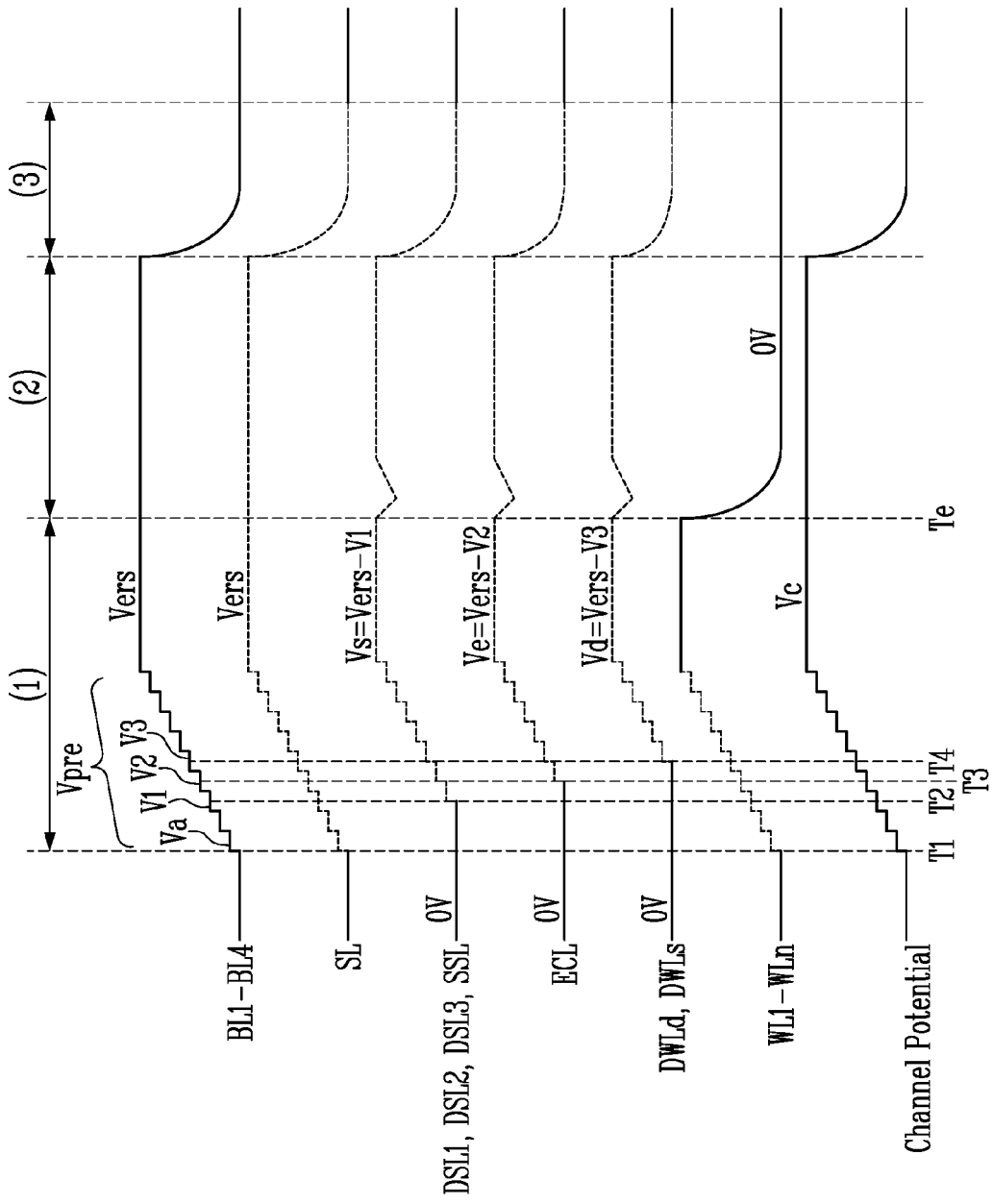
FIG. 3 is a waveform diagram of signals applied during an erase operation in accordance with an embodiment of the present disclosure.

FIG. 3 is a waveform diagram of signals applied during an erase operation in accordance with an embodiment of the present disclosure. FIG. 3 briefly illustrates an erase operation of the cell strings CS1 to CS8 of the first to fourth column groups, which are shown in FIG. 2.

Referring to FIG. 3, the erase operation may include a GIDL forming period (1) and a cell erasing period (2). Signals applied to the memory cell array may be controlled such that hot holes can be injected into a channel of a plurality of memory cells during the GIDL forming period (1), and be controlled such that data stored in the plurality of memory cells can be erased during the cell erasing period (2).

During the GIDL forming period (1), a voltage applied to selected bit lines (e.g., BL1 to BL4) may be controlled to increase from a pre-erase voltage Vpre to an erase voltage Vers, the source conductive pattern SL may be floated. When the pre-erase voltage Vpre is applied to the selected bit lines BL1 to BL4, a potential of the source conductive pattern SL in the floating state may be increased by a potential of the selected bit lines BL1 to BL4 due to coupling.

The pre-erase voltage Vpre may be applied to the selected bit lines (e.g., BL1 to BL4) at a first time T1. The pre-erase voltage Vpre may be gradually increased from a start voltage level Va lower than the erase voltage Vers to a level of the erase voltage Vers.

During the GIDL forming period (1), the drain select lines DSL1 to DSL3, the source select line SSL, the erase control line ECL, the drain-side dummy word line DWLd, and the source-side dummy word line DWLs, which are connected to selected cell strings, may be floated after the first time T1. In an embodiment, a floating time of the drain select lines DSL1 to DSL3, the source select line SSL, the erase control line ECL, the drain-side dummy word line DWLd, and the source-side dummy word line DWLs may become earlier as the drain select lines DSL1 to DSL3, the source select line SSL, the erase control line ECL, the drain-side dummy word line DWLd, and the source-side dummy word line DWLs come closer to the source conductive pattern SL and the selected bit lines BL1 to BL4. For example, the drain select lines DSL1 to DSL3 and the source select line SSL may be floated at a second time T2 after the first time T1, the erase control line ECL may be floated at a third time T3 after the second time T2, and the drain-side dummy word line DWLd and the source-side dummy word line DWLs may be floated at a fourth time T4 after the third time T3. A voltage applied to the drain select lines DSL1 to DSL3 and the source select line SSL before the second time T2, a voltage applied to the erase control line ECL before the third time T3, and a voltage applied to the drain-side dummy word line DWLd and the source-side dummy word line DWLs before the fourth time T4 may be controlled to become 0V.

The voltage of each of the drain select lines DSL1 to DSL3 and the source select line SSL may be increased due to coupling from the second time T2. In an embodiment, the pre-erase voltage Vpre of a first voltage V1 may be applied at the second time T2. The voltage of each of the drain select lines DSL1 to DSL3 and the source select line SSL may be increased by a first coupling voltage (Vs=Vers−V1) corresponding to the difference between the erase voltage Vers and the first voltage V1 from the second time T2.

The voltage of the erase control line ECL may be increased due to coupling from the third time T3. In an embodiment, the pre-erase voltage Vpre of a second voltage V2 higher than the first voltage V1 may be applied at the third time T3. The voltage of the erase control line ECL may be increased by a second coupling voltage (Ve=Vers−V2) corresponding to the difference between the erase voltage Vers and the second voltage V2 from the third time T3.

The voltage of each of the drain-side dummy word line DWLd and the source-side dummy word line DWLs may be increased due to coupling from the fourth time T4. In an embodiment, the pre-erase voltage Vpre of a third voltage V3 higher than the second voltage V2 may be applied at the fourth time T4. The voltage of each of the drain-side dummy word line DWLd and the source-side dummy word line DWLs may be increased by a third coupling voltage (Vd=Vers−V3) corresponding to the difference between the erase voltage Vers and the third voltage V3 from the fourth time T4.

During the GIDL forming period (1), a GIDL current may be generated by a voltage difference between the selected bit lines BL1 to BL4 and the drain select lines DSL1 to DSL3 or a voltage difference between the source conductive pattern SL having a boosting voltage and the source select line SSL. Therefore, generated hot holes may be injected into a channel of a selected cell string. Accordingly, a channel potential of the selected cell string may be increased by a channel voltage Vc corresponding to the erase voltage Vers.

During the GIDL forming period (1), the word lines WL1 to WLn connected to the selected cell strings may be floated. Accordingly, a voltage of each of the word lines WL1 to WLn may be increased due to coupling.

The pre-erase voltage Vpre may reach the erase voltage Vers after the fourth time T4.

An erase permission voltage may be applied to the word lines WL1 to WLn at an erase time Te at which the cell erase period (2) is started. The erase voltage Vers may be maintained from the fourth time T4 to the erase time Te, and be maintained during the cell erase period (2).

The erase permission voltage may be set such that the voltage difference between the erase permission voltage and the erase voltage Vers can generate Fowler-Nordheim (F-N) tunneling. In an embodiment, the erase permission voltage may be set to 0V.

During the cell erase period (2), data stored in the memory cells may be erased by the channel voltage Vc and a voltage difference between the word lines WL1 to WLn.

Figure 4:
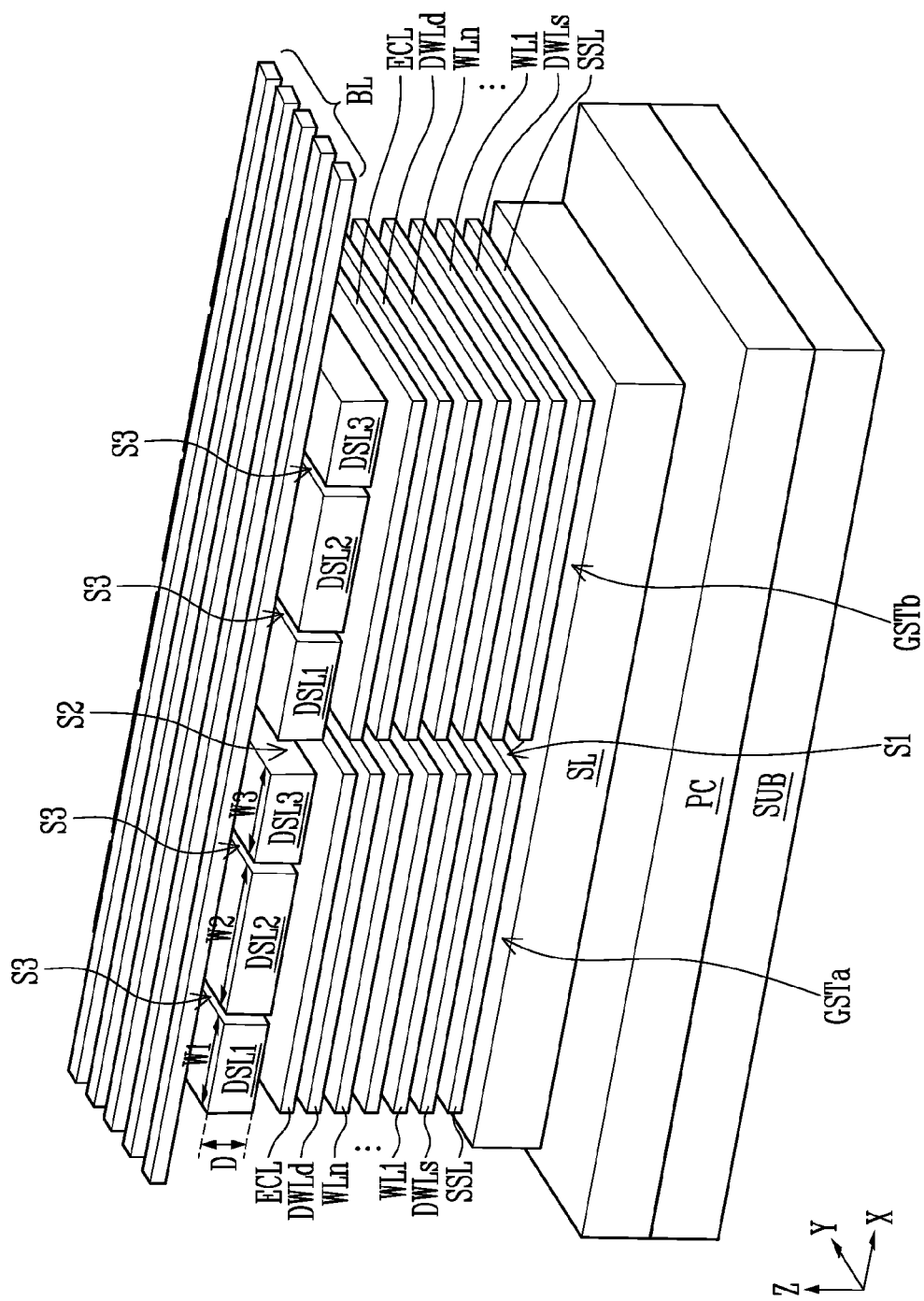
FIG. 4 is a perspective view illustrating a semiconductor memory device in accordance with an embodiment of the present disclosure.
Figure 5:
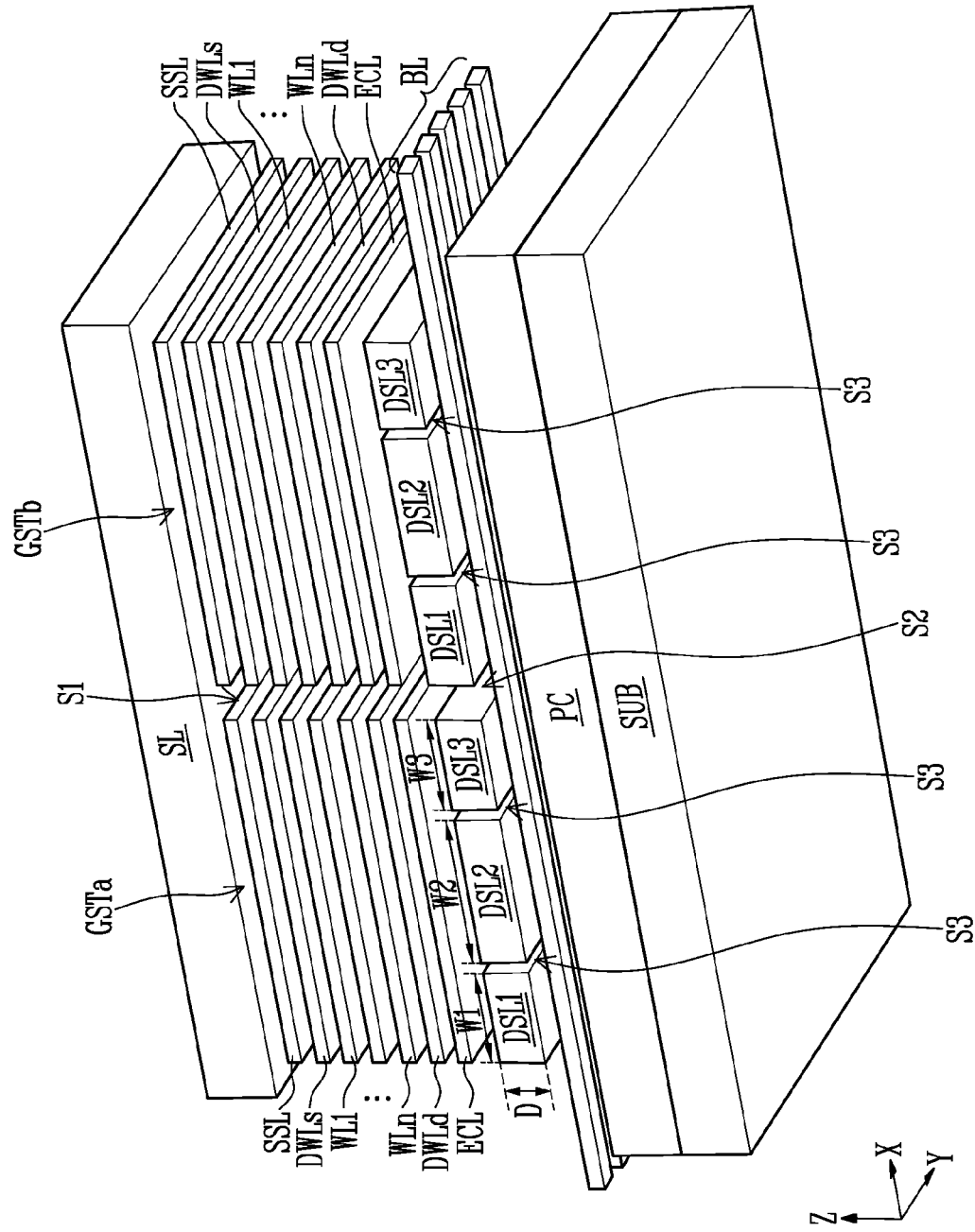
FIG. 5 is a perspective view illustrating a semiconductor memory device in accordance with an embodiment of the present disclosure.

FIGS. 4 and 5 are perspective views illustrating semiconductor memory devices in accordance with embodiments of the present disclosure.

Referring to FIGS. 4 and 5, each of the semiconductor memory devices may include a substrate SUB in which a peripheral circuit PC is formed, a source conductive pattern SL, gate stack structures GSTa and GSTb, and bit lines BL, the source conductive pattern SL, the gate stack structures GSTa and GSTb, and the bit lines BL disposed on the peripheral circuit PC. The gate stack structures GSTa and GSTb may be disposed between the bit lines BL and the source conductive pattern SL. The vertical arrangement of the source conductive pattern SL, the gate stack structures GSTa and GSTb, and the bit lines BL may have an arrangement shown in FIG. 4 or have an arrangement shown in FIG. 5.

In an embodiment, the source conductive pattern SL may be disposed between the peripheral circuit PC and the gate stack structures GSTa and GSTb as shown in FIG. 4. Interconnections (not shown) may be disposed between the peripheral circuit PC and the source conductive pattern SL. As shown in FIG. 4, the substrate SUB including the peripheral circuit PC may be disposed closer to the source conductive pattern SL than the bit lines BL.

In an embodiment, the bit lines BL may be disposed between the peripheral circuit PC and the gate stack structures GSTa and GSTb as shown in FIG. 5. Interconnections (not shown) may be disposed between the peripheral circuit PC and the bit lines BL. In an embodiment, the interconnections between the peripheral circuit PC and the bit lines BL may be connected to each other by copper bonding. As shown in FIG. 5, the substrate SUB including the peripheral circuit PC may be disposed closer to the bit lines BL than the source conductive pattern SL.

Referring back to FIGS. 4 and 5, each of the bit lines BL may extend in a first direction X. The bit lines BL may be spaced apart from each other in a second direction Y. The first direction X may be a direction in which an X axis of an XYZ coordinate system faces, and the second direction Y may be a direction in which a Y axis of the XYZ coordinate system faces. The bit lines BL may be formed of various conductive materials.

The source conductive pattern SL may be formed in the shape of a flat plate expanding in the first direction X and the second direction Y. The source conductive pattern SL may include a doped semiconductor layer. In an embodiment, the source conductive pattern SL may include an n-type doped silicon layer.

The gate stack structures GSTa and GSTb may be arranged in the first direction X. Each of the gate stack structures GSTa and GSTb may be formed to surround pillar structures (not shown), and the pillar structures may be connected to the bit lines BL via contact plugs (not shown). The pillar structures may be formed to be in contact with the source conductive pattern SL.

Each of the gate stack structures GSTa and GSTb may include at least two drain select lines DSL1 to DSL3 and plate electrodes SSL, DWLs, WL1 to WLn, DWLd, and ECL. The at least two drain select lines DSL1 to DSL3 may be spaced apart from each other in the first direction X at the same level. The plate electrodes SSL, DWLs, WL1 to WLn, DWLd, and ECL may be disposed between the at least two drain select lines DSL1 to DSL3 and the source conductive pattern SL. Each of the drain select lines DSL1 to DSL3 may extend in the second direction Y. In an embodiment, the at least two drain select lines DSL1 to DSL3 may include a first drain select line DSL1, a second drain select line DSL2, and a third drain select line DSL3. The first drain select line DSL1, the second drain select line DSL2, and the third drain select line DSL3 may be spaced apart from each other in the first direction X at the same level, and extend in the second direction Y.

The plate electrodes SSL, DWLs, WL1 to WLn, DWLd, and ECL may be stacked in a third direction Z to be spaced apart from each other. The third direction Z may be a direction in which a Z axis of the XYZ coordinate system faces. The plate electrodes SSL, DWLs, WL1 to WLn, DWLd, and ECL may include a plurality of word lines WL1 to WLn stacked in the third direction Z to be spaced apart from each other, at least one source select line SSL disposed between the plurality of word lines WL1 to WLn and the source conductive pattern SL, and an erase control line ECL disposed between the plurality of word lines WL1 to WLn and the at least two drain select lines DSL1 to DSL3. The plate electrodes SSL, DWLs, WL1 to WLn, DWLd, and ECL may further include at least one of a drain-side dummy word line DWLd and a source-side dummy word line DWLs. The drain-side dummy word line DWLd may be disposed between the plurality of word lines WL1 to WLn and the erase control line ECL and the source-side dummy word line DWLs disposed between the plurality of word lines WL1 to WLn and a source select line SSL. A width of each of the plate electrodes SSL, DWLs, WL1 to WLn, DWLd, and ECL may be formed wider than each of widths W1 to W3 of the drain select lines DSL1 to DSL3. That is, each of the drain select lines DSL1 to DSL3 may be formed narrower than each of the erase control line ECL, the drain-side dummy word line DWLd, the word lines WL1 to WLn, the source-side dummy word line DWLs, and the source select line SSL.

A thickness D of each of the drain select lines DSL1 to DSL3 may be thicker than that of each of the plate electrodes SSL, DWLs, WL1 to WLn, DWLd, and ECL.

The gate stack structures GSTa and GSTb may include a first gate stack structure GSTa and a second gate stack structure GSTb, which are adjacent to each other. The plate electrodes SSL, DWLs, WL1 to WLn, DWLd, and ECL of the first gate stack structure GSTa may be isolated from the plate electrodes SSL, DWLs, WL1 to WLn, DWLd, and ECL of the second gate stack structure GSTb by a first slit S1. The drain select lines DSLl to DSL3 of the first gate stack structure GSTa may be isolated from the drain select lines DSL1 to DSL3 of the second gate stack structure GSTb by a second slit S2. The second slit S2 may be connected to the first slit S1. The drain select lines DSL1 to DSL3 of each of the gate stack structures GSTa and GSTb may be isolated from each other by third slits S3.

Figure 6A:
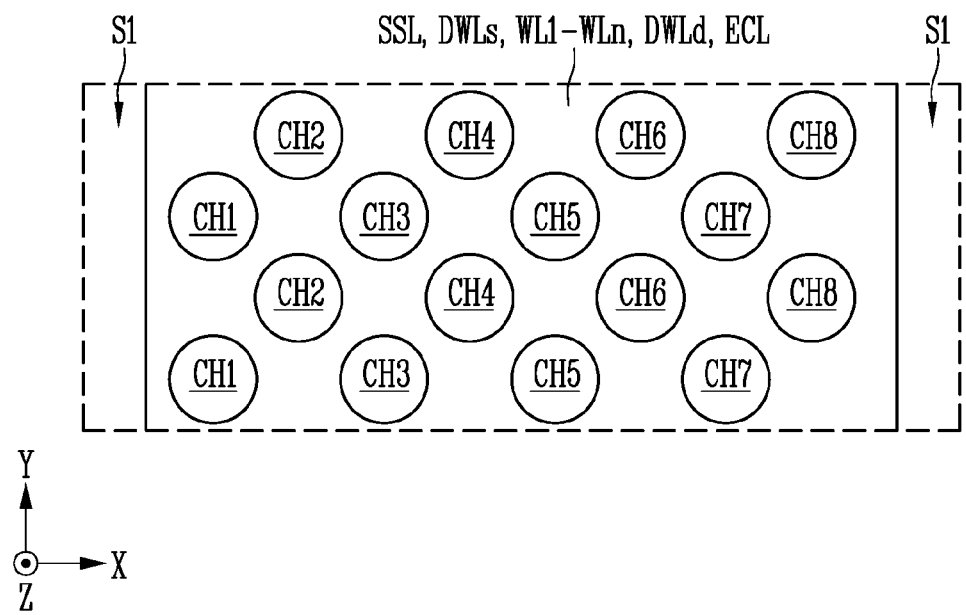
FIGS. 6A, 6B, and 6C are plan views illustrating a semiconductor memory device in accordance with an embodiment of the present disclosure.
Figure 6B:
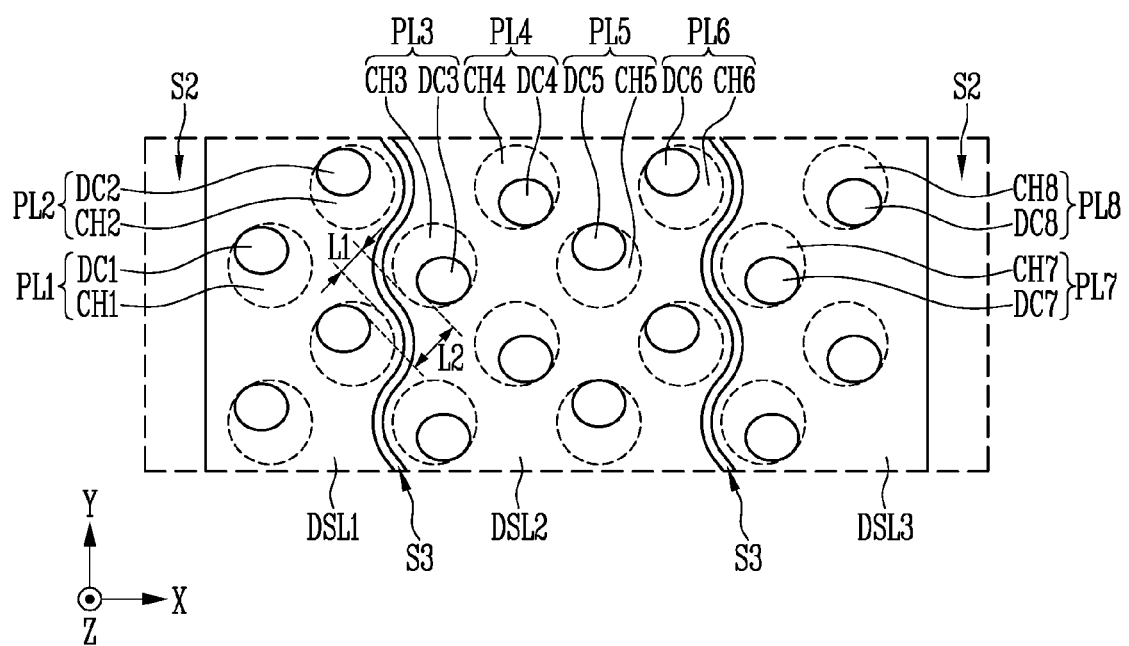
Figure 6C:
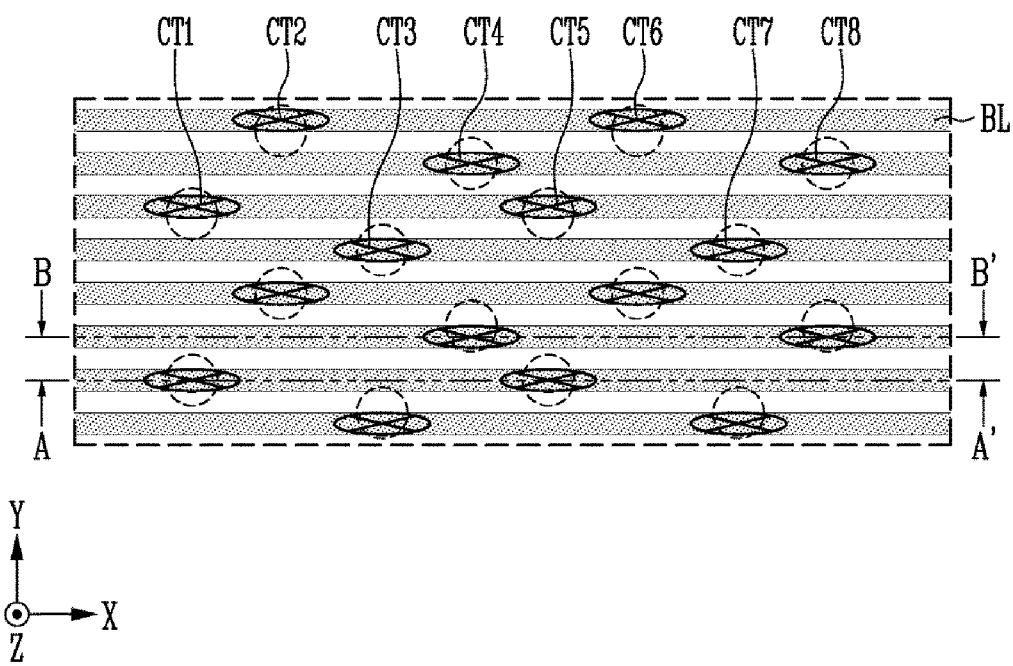

FIGS. 6A, 6B, and 6C are plan views illustrating a semiconductor memory device in accordance with an embodiment of the present disclosure.

FIG. 6A is a plan view illustrating plate electrodes SSL, DWLs, WL1 to WLn, DWLd, and ECL in accordance with an embodiment of the present disclosure.

Referring to FIG. 6A, the plate electrodes SSL, DWLs, WL1 to WLn, DWLd, and ECL may include sidewalls defined along first slits S1. The plate electrodes SSL, DWLs, WL1 to WLn, DWLd, and ECL may be penetrated by channel structures CH1 to CH8 extending in a third direction Z. The channel structures CH1 to CH8 may be arranged in zigzag or be arranged while forming a matrix structure.

FIG. 6B is a plan view illustrating at least two drain select lines DSL1 to DSL3 in accordance with an embodiment of the present disclosure.

Referring to FIG. 6B, the at least two drain select lines DSL1 to DSL3 may be spaced apart from each other in a first direction X by a third slit S3 between second slits S2. The at least two drain select lines DSL1 to DSL3 may include an odd-numbered drain select line DSL1 or DSL3 and an even-numbered drain select line DSL2, which are alternately disposed in the first direction X.

The second slits S2 may be respectively connected to the first slits S1 shown in FIG. 6A, and extend in the third direction Z. The third slit S3 may overlap with the plate electrodes SSL, DWLs, WL1 to WLn, DWLd, and ECL shown in FIG. 6A.

The drain select lines DSL1 to DSL3 nay be penetrated by drain-side channel structures DC1 to DC8 extending in the third direction Z. The drain-side channel structures DC1 to DC8 may be arranged in zigzag or be arranged while forming a matrix structure. The drain-side channel structures DC1 to DC8 may be respectively connected to the channel structures CH1 to CH8 shown in FIG. 6A.

The drain-side channel structures DC1 to DC8 and the channel structures CH1 to CH8 nay define pillar structures PL1 to PL8 penetrating a gate stack structure. The pillar structures PL1 to PL8 may be divided into at least two pillar groups by the third slit S3. The at least two pillar groups may be respectively correspond to the at least two drain select lines DSL1 to DSL3. In an embodiment, the pillar structures PL1 to PL8 may be divided into an odd pillar group penetrating the odd-numbered drain select line DSL1 and DLS3 and an even pillar group penetrating the even-numbered drain select line DSL2.

The drain-side channel structures DC1 to DC8 may be formed narrower than the channel structures CH1 to CH8. Accordingly, an arrangement space of the third slit S3 can be secured. The third slit S3 may be arranged between the odd pillar group and the even pillar group, which are adjacent to each other. A distance L2 between a drain-side channel structure of the odd pillar group and a drain-side channel structure of the even pillar group, which are adjacent to each other with the third slit S3 interposed therebetween, may be wider than that L1 between a channel structure of the odd pillar group and a channel structure of the even pillar group.

FIG. 6C is a plan view illustrating bit line BL in accordance with an embodiment of the present disclosure.

Referring to FIG. 6C, the bit lines BL may be connected to the drain-side channel structures DC1 to DC8 shown in FIG. 6B via contact plugs CT1 to CT8 extending in the third direction Z.

Referring to FIGS. 6A to 6C, in an embodiment, the pillar structures PL1 to PL8 may be divided into first to eighth columns, and the contact plugs CT1 to CT8 may be respectively connected to the pillar structures PL1 to PL8 of the first to eighth columns.

The pillar structure PL1 of the first column and the pillar structure PL2 of a second column may constitute a first odd pillar group penetrating a first drain select line DSL1. The pillar structure PL1 of the first column may include a drain-side channel structure DC1 of the first column, which penetrates the first drain select line DSL1, and a channel structure CH1 of the first column, which penetrates the plate electrodes SSL, DWLs, WL1 to WLn, DWLd, and ECL. The pillar structure PL2 of the second column may include a drain-side channel structure DC2 of the second column, which penetrates the first drain select line DSL1, and a channel structure CH2 of the second column, which penetrates the plate electrodes SSL, DMA, WL1 to WLn, DWLd, and ECL.

The pillar structure PL3 of the third column, the pillar structure PL4 of the fourth column, the pillar structure PL5 of the fifth column, and the pillar structure PL6 of the sixth column may constitute an even pillar group penetrating a second drain select line DSL2. The pillar structure PL3 of the third column may include a drain-side channel structure DC3 of the third column, which penetrates the second drain select line DSL2, and a channel structure CH3 of the third column, which penetrates the plate electrodes SSL, DWLs, WL1 to WLn, DWLd, and ECL. The pillar structure PL4 of the fourth column may include a drain-side channel structure DC4 of the fourth column, which penetrates the second drain select line DSL2, and a channel structure CH4 of the fourth column, which penetrates the plate electrodes SSL, DWLs, WL1 to WLn, DWLd, and ECL. The pillar structure PL5 of the fifth column may include a drain-side channel structure DC5 of the fifth column, which penetrates the second drain select line DSL2, and a channel structure CH5 of the fifth column, which penetrates the plate electrodes SSL, DWLs, WL1 to WLn, DWLd, and ECL. The pillar structure PL6 of the sixth column may include a drain-side channel structure DC6 of the sixth column, which penetrates the second drain select line DSL2, and a channel structure CH6 of the sixth column, which penetrates the plate electrodes SSL, DWLs, WL1 to WLn, DWLd, and ECL.

The pillar structure PL7 of the seventh column and the pillar structure PL8 of the eighth column may constitute a second odd pillar group penetrating a third drain select line DSL3. The pillar structure PL7 of the seventh column may include a drain-side channel structure DC7 of the seventh column, which penetrates the third drain select line DSL3, and a channel structure CH7 of the seventh column, which penetrates the plate electrodes SSL, DWLs, WL1 to WLn, DWLd, and ECL. The pillar structure PL8 of the eighth column may include a drain-side channel structure DC8 of the eighth column, which penetrates the third drain select line DSL3, and a channel structure CH8 of the eighth column, which penetrates the plate electrodes SSL, DWLs, WL1 to WLn, DWLd, and ECL.

Each of the first slit S1, the second slit S2, and the third slit S3, which are shown in FIGS. 6A and 6B, may extend in a straight line shape, extend in a zigzag shape, or extend in a wave shape. The width of each of the first slit S1, the second slit S2, and the third slit S3 may be variously changed according to design rules.

Figure 7A:
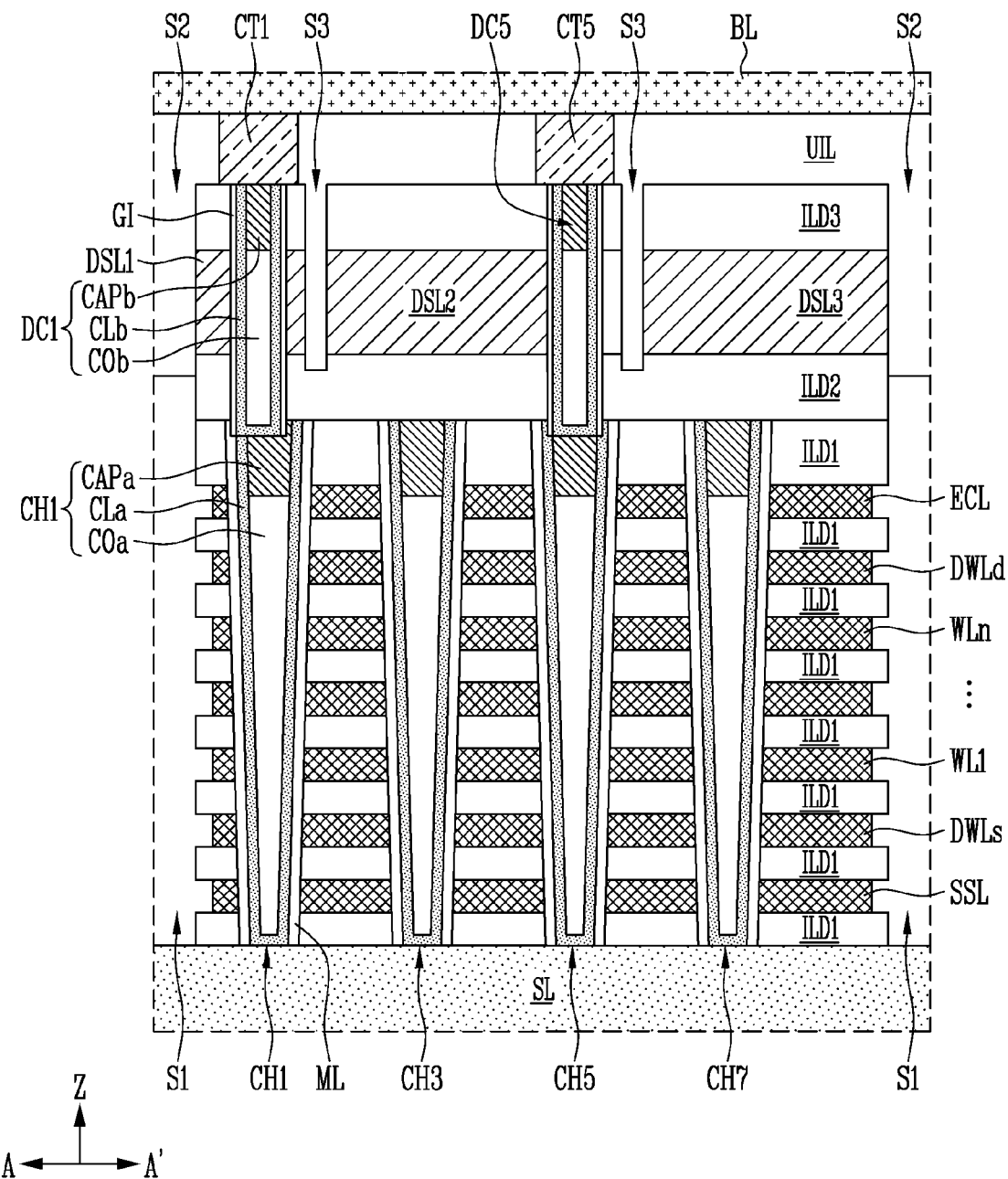
FIGS. 7A and 7B are sectional views taken along line "A-A" and "B-B" shown in FIG. 6C.
Figure 7B:
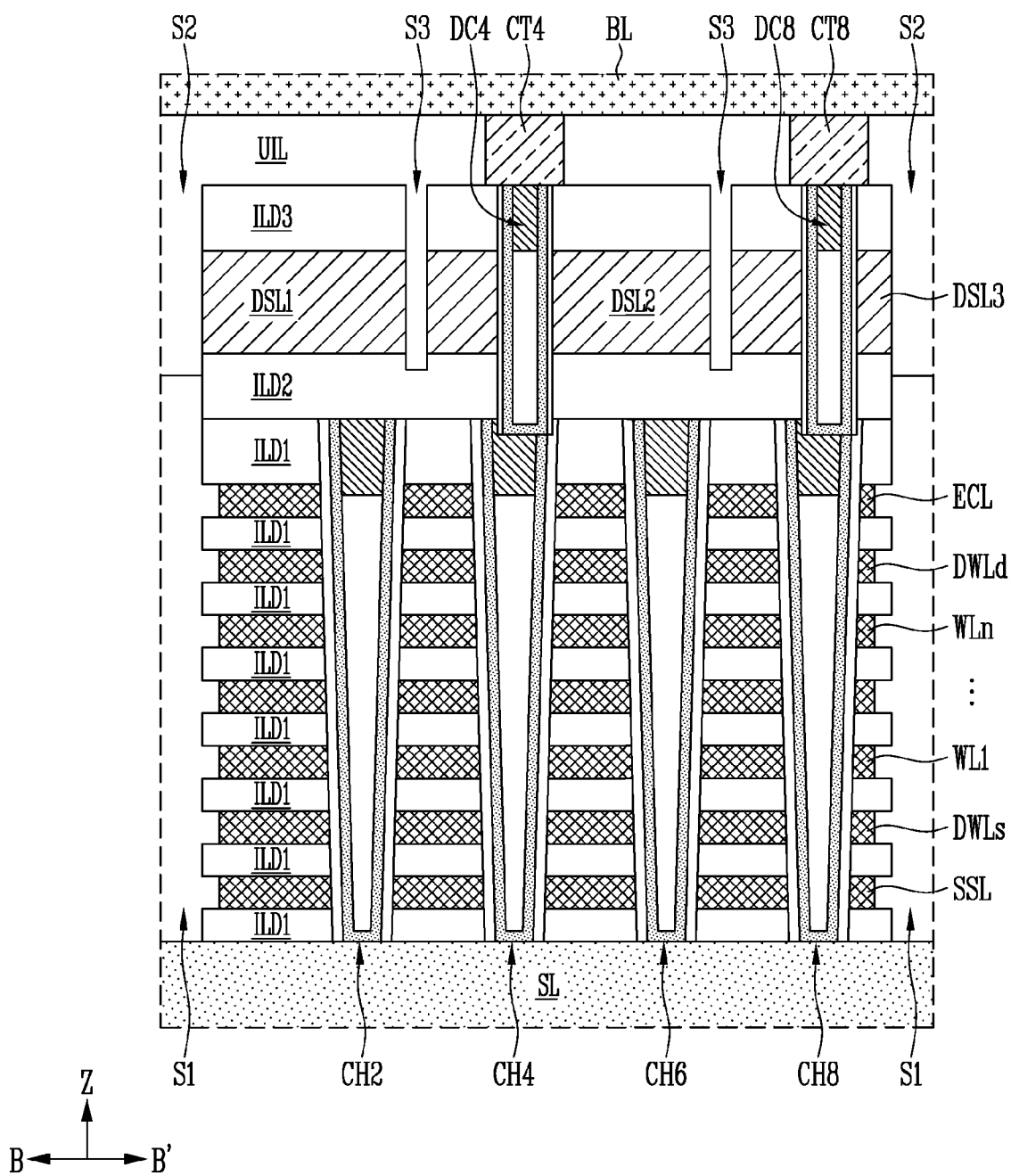

FIGS. 7A and 7B are sectional views taken along line "A-A" and "B-B" shown in FIG. 6C, FIGS. 7A and 73 illustrate sections of components disposed between a source conductive pattern SL and a bit line BL.

Referring to FIGS. 7A and 7B, the plate electrodes SSL, DWLs, WL1 to WLn, DWLd, and ECL and first interlayer insulating layers ILD1 may be alternately stacked between the source conductive pattern SL and the bit line BL. The channel structures CH1 to CH8 may extend in the third direction Z from the source conductive pattern SL. The channel structures CH1 to CFH8 may penetrate the plate electrodes SSL, DWLs, WL1 to WLn, DWLd, and ECL and the first interlayer insulating layers ILD1.

A sidewall of each of the channel structures CH1 to CH8 may be surrounded by a memory layer ML. Each of the channel structures CH1 to CH8 may include a first core insulating layer COa, a first capping pattern CAPa, and a first channel layer CLa. The first capping pattern CAPa may be disposed on the first core insulating layer COa, and include a doped semiconductor layer. In an embodiment, the first capping pattern CAPa may include an n-type doped silicon layer. The first channel layer CLa may extend along a bottom surface of the first core insulating layer COa, a sidewall of the first core insulating layer COa, and a sidewall of the first capping pattern CAPa. The first channel layer CLa may extend to be in contact with the source conductive pattern SL, and be formed of a semiconductor layer. In order to generate a GIDL current in an erase operation, the first capping pattern CAPa may extend to face a sidewall of an erase control line ECL.

The drain select lines DSL1 to DSL3 isolated from each other at the same level by the third slit S3 may be disposed between a second interlayer insulating layer ILD2 and a third interlayer insulating layer ILD3. The second interlayer insulating layer ILD2 may be disposed between a stacked structure of the plate electrodes SSL, DWLs, WL1 to WLn, DWLd, and ECL and the first interlayer insulating layers ILD1 and the drain select lines DSL1 to DSL3. The third interlayer insulating layer ILD3 may be disposed between the bit line BL and the drain select lines DSL1 to DSL3. The third slit S3 may extend to penetrate the third interlayer insulating layer ILD3. The third slit S3 may be filled with an upper insulating layer UIL. The upper insulating layer UIL may extend between the bit line BL and the third interlayer insulating layer ILD3.

The drain-side channel structures DC1 to DC8 shown in FIG. 6B may extend from the channel structures CH1 to CH8, and penetrate the second interlayer insulating layer ILD2, the drain select lines DSL1 to DSL3, and the third interlayer insulating layer ILD3. A sidewall of each of the drain-side channel structures DC1 to DC8 shown in FIG. 6B may be surrounded by a gate insulating layer GI as shown in FIGS. 7A and 7B.

Each of the drain-side channel structures DC1 to DC8 shown in FIG. 6B may include a second core insulating layer Cob, a second capping pattern CAPb, and a second channel layer CLb as shown in FIGS. 7A and 7B. The second capping pattern CAPb may be disposed on the second core insulating layer Cob, and include a doped semiconductor layer. In an embodiment, the second capping pattern CAPb may include n-type doped silicon layer. The second channel layer CLb may extend along a bottom surface of the second core insulating layer Cob, a sidewall of the second core insulating layer Cob, and a sidewall of the second capping pattern CAPb. The second channel layer CLb may extend to be in contact with the first capping pattern CAPa, and be formed of a semiconductor layer. However, the embodiments of the present disclosure are not limited thereto. Although not shown in the drawings, in an embodiment, each of the drain-side channel structures DC1 to DC8 may include the second capping pattern CAPb connected to the first capping pattern CAPa to extend toward the bit line BL and the gate insulating layer GI surrounding the sidewall of the second capping pattern CAPb.

As shown in FIGS. 7A and 7B, the contact plugs CT1 to CT8 shown in FIG. 6C may penetrate the upper insulating layer UIL, and extend toward the bit line BL from the drain-side channel structures DC1 to DC8.

Figure 8:
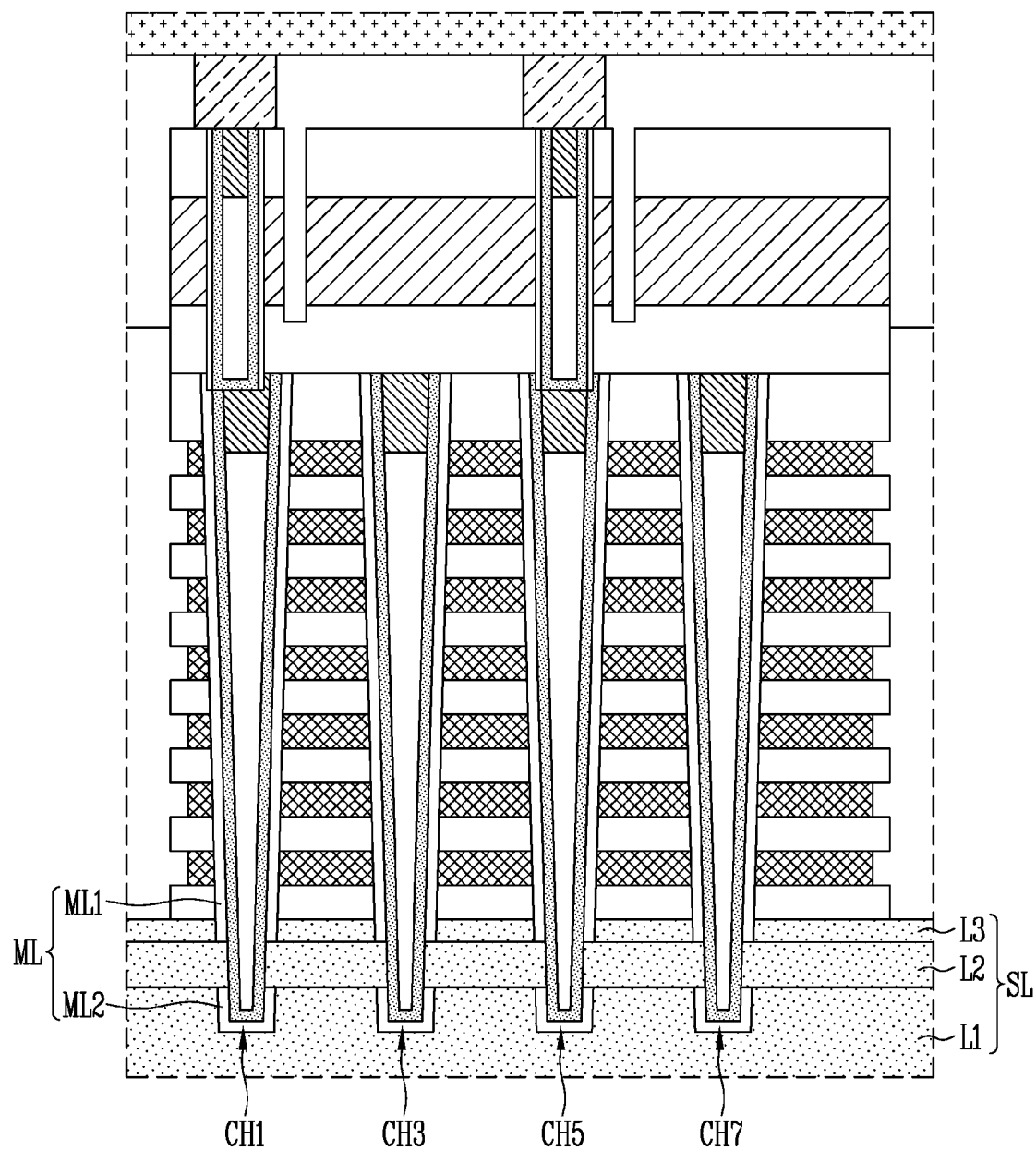
FIG. 8 is a sectional view illustrating a semiconductor memory device in accordance with an embodiment of the present disclosure.

FIG. 8 is a sectional view illustrating a semiconductor memory device in accordance with an embodiment of the present disclosure. FIG. 8 is a sectional view illustrating a modification of the source conductive pattern SL and the memory layer ML, and descriptions of components identical to those shown in FIGS. 7A and 7B will be omitted. FIG. 8 illustrates a section taken along the line "A-A'" shown in FIG. 6C.

Referring to FIG. 8, a source conductive pattern SL may include a stacked structure of a first source layer L1 and a second source layer L2 or include a stacked structure of the second source layer L2 and a third source layer L3. Each of the first source layer L1, the second source layer L2, and the third source layer L3 may include a doped semiconductor layer. In an embodiment, each of the first source layer L1, the second source layer L2, and the third source layer L3 may include n-type doped silicon.

As shown in FIG. 8, each of the channel structures CH1 to CH8 shown in FIG. 6A may extend to penetrate the second source layer L2 and the third source layer L3 from the inside of the first source layer L1. Each of the channel structures CH1 to CH8 shown in FIG. 6A may be surrounded by a memory layer ML. The second source layer L2 may penetrate the memory layer ML and be in contact with the sidewall of each of the channel structures CH1 to CH8 shown in FIG. 6A. The memory layer ML may be isolated into a first memory pattern ML1 and a second memory pattern ML2 by the second source layer L2.

The first memory pattern ML1 may be disposed between the channel structure and the third source layer L3 and extend along the sidewall of a channel structure corresponding to the first memory pattern ML1. The second memory pattern ML2 may be disposed between the first source layer L1 and a channel structure corresponding to the second memory pattern ML2.

Figure 9A:
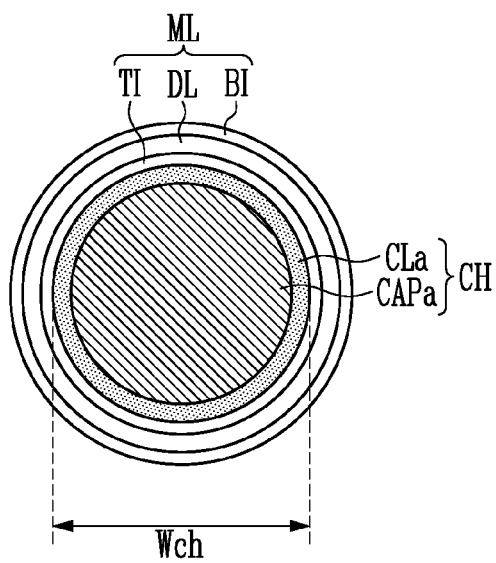
FIGS. 9A and 9B are enlarged views illustrating a cross-section of a channel structure and a cross-section a drain-side channel structure in accordance with an embodiment of the present disclosure.
Figure 9B:
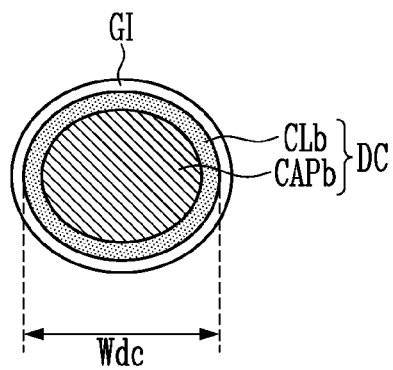

FIGS. 9A and 9B are enlarged views illustrating a cross-section of a channel structure CH and a cross-section a drain-side channel structure DC in accordance with an embodiment of the present disclosure.

Referring to FIGS. 9A and 9B, at a level at which an interface between the channel structure CH and the drain-side channel structure DC is disposed, a width Wdc of the drain-side channel structure DC may be formed narrower than that Wch of the channel structure CH.

Each of the drain-side channel structures DC1 to DC8 shown in FIG. 6B is formed to have a narrow width Wdc as shown in FIG. 9B, so that a wide distance between the drain-side channel structures DC to DC8 can be secured within a limited area.

Referring to FIG. 9A, a sidewall of the channel structure CH may be surrounded by a memory layer ML. The memory layer ML may include a tunnel insulating layer TI, a data storage layer DL extending along an outer wall of the tunnel insulating layer TI, and a blocking insulating layer BI extending along an outer wall of the data storage layer DL. The data storage layer DL may be formed of a material layer capable of storing data. In an embodiment, the data storage layer DL may be formed of a material layer capable of storing data changed by using Fowler-Nordheim (F-N) tunneling. To this end, the data storage layer DL may include a nitride layer in which charges can be trapped. However, the present disclosure is not limited thereto, and the data storage layer DL may include silicon, a phase change material, nano dots, etc. The blocking insulating layer BI may include an oxide layer capable of blocking charges. The tunnel insulating layer TI may be formed of a silicon oxide layer through which charges can tunnel.

The channel structure CH may include a first capping pattern CAPa and a first channel layer CLa surrounding the first capping pattern CAPa. As shown in FIGS. 7A and 7B, the first capping pattern CAPa does not penetrate the drain select lines DSL1 to DSL3, and is disposed adjacent to the erase control line ECL. Thus, it is easy to control a depth of the first capping pattern CAPa such that the first capping pattern CAPa faces at least a portion of the erase control line ECL. Accordingly, although a dopant in the first capping pattern CAPa is not diffused into the first channel layer CLa, a GIDL current can be generated in the erase control line during an erase operation.

Referring to FIG. 9B, a sidewall of the drain-side channel structure DC may be surrounded by a gate insulating layer GI. The gate insulating layer GI may be formed in a structure further simplified than the memory layer ML shown in FIG. 9A. In an embodiment, the gate insulating layer GI may include a silicon oxide layer.

The drain-side channel structure DC may include a second capping pattern CAPb and a second channel layer CLb surrounding the second capping pattern CAPb. Alternatively, although not shown in the drawing, the drain-side channel structure DC may include the second capping pattern CAPb in contact with the gate insulating layer GI. The drain-side channel structure DC may be disposed on any one of the channel structures CH1 to CH8 as shown in FIGS. 7A and 7B. Since a depth of the drain-side channel structure DC is shallower than that of each of the channel structures CH1 to CH8, and a depth of the second capping pattern CAPb in the drain-side channel structure DC can be easily controlled. Accordingly, although the width Wdc of the drain-side channel structure DC is formed relatively narrow, the expanding depth of the second capping pattern CAPb in the drain-side channel structure DC is increased, thereby securing a GIDL current in an erase operation.

Figure 10A:
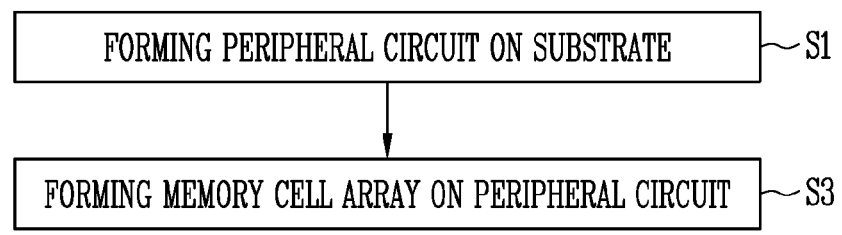
FIGS. 10A and 10B are flowcharts schematically illustrating a manufacturing method of a semiconductor memory device in accordance with an embodiment of the present disclosure.
Figure 10B:
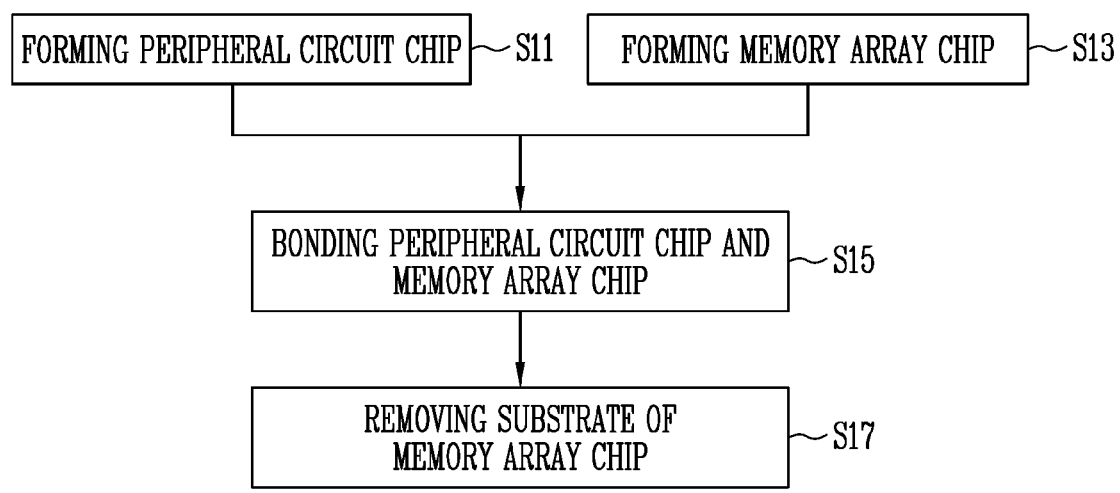

FIGS. 10A and 10B are flowcharts schematically illustrating a manufacturing method of a semiconductor memory device in accordance with an embodiment of the present disclosure.

Referring to FIG. 10A, the manufacturing method of the semiconductor memory device may include step S1 of forming a peripheral circuit on a substrate and step S2 of forming a memory cell array on the peripheral circuit.

In the step S1, the substrate SUB including the peripheral circuit PC, which is shown in FIG. 4, may be provided.

In the step S3, the source conductive pattern SL, the gate stack structures GSTa and GSTb, and the bit lines BL, which are shown in FIG. 4, may be formed.

Although not shown in the drawing, conductive patterns for interconnections may be formed on the peripheral circuit PC.

Referring to FIG. 10B, the manufacturing method of the semiconductor memory device may include step S11 of forming a peripheral circuit chip, step S13 forming a memory array chip, step S15 of bonding the peripheral circuit chip and the memory array chip, and step S17 of removing a substrate of the memory array chip.

In the step S11, the substrate SUB including the peripheral circuit PC, which is shown in FIG. 5, may be provided. Although not shown in the drawing, the step S11 may include step of forming first interconnections connected to the peripheral circuit PC.

The step S13 may include step of forming, on a first surface of the substrate, the gate stack structures GSTa and GSTb and the bit lines BL, which are shown in FIG. 5. Although not shown in the drawing, the step S13 may include step of forming second interconnections connected to the gate stack structures GSTa and GSTb and the bit lines BL.

The step S15 may include step of bonding the first interconnections of the peripheral circuit chip to the second interconnections of the memory array chip. The memory array chip may be aligned such that the first surface of the substrate of the memory array chip faces the peripheral circuit chip.

The step S17 may include step of removing the substrate of the memory array chip from a second surface of the substrate, which is opposite to the first surface of the substrate of the memory array chip. Subsequently, the source conductive pattern SL shown in FIG. 5 may be formed in a region in which the substrate is removed.

Figure 11A:
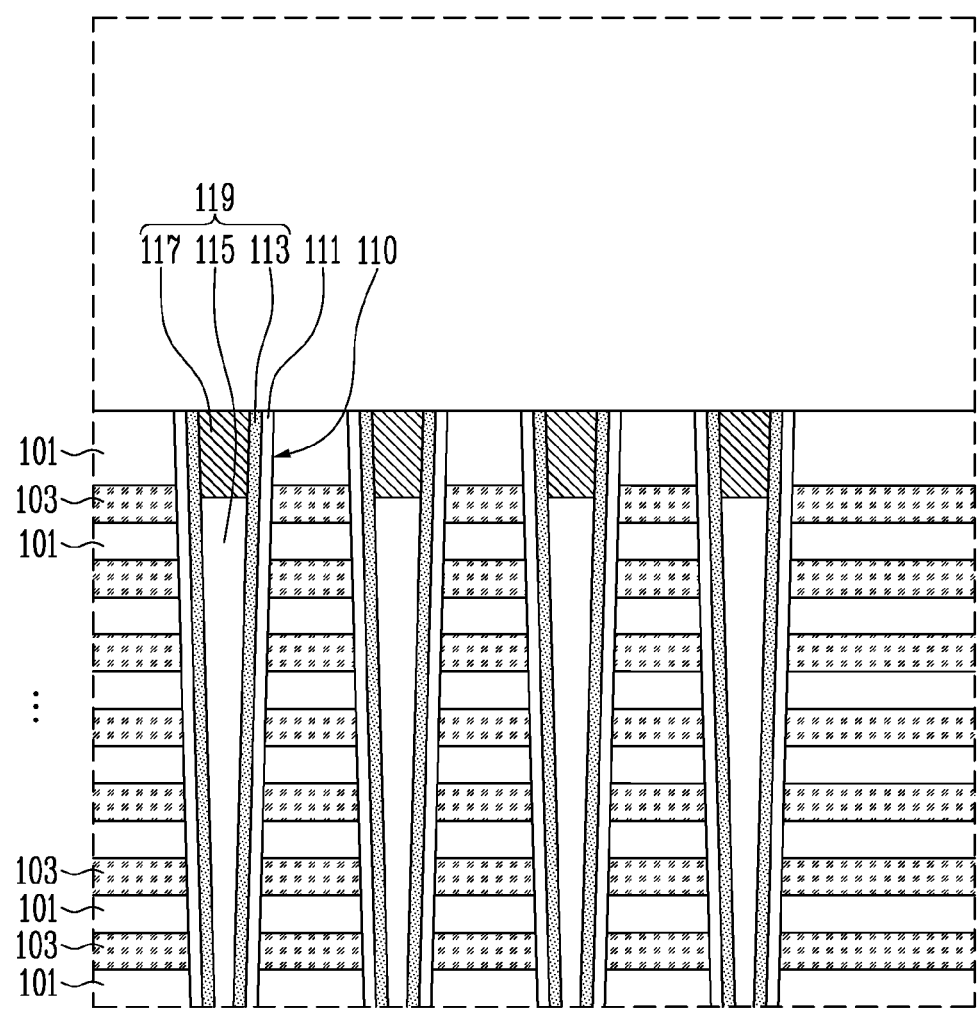
FIGS. 11A, 11B, 11C, 11D, 11E, 11F, and 11G are sectional views illustrating a manufacturing method of a semiconductor memory device in accordance with an embodiment of the present disclosure.
Figure 11B:
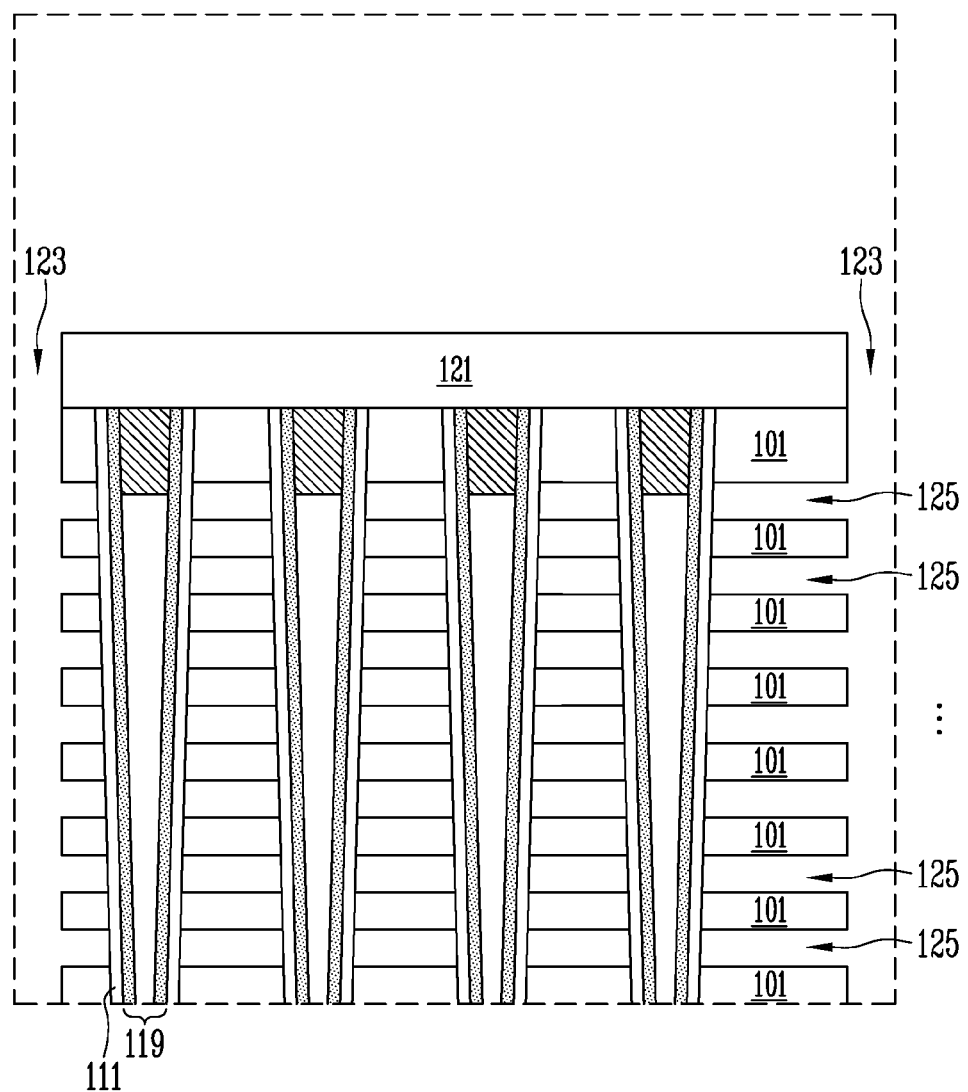
Figure 11C:
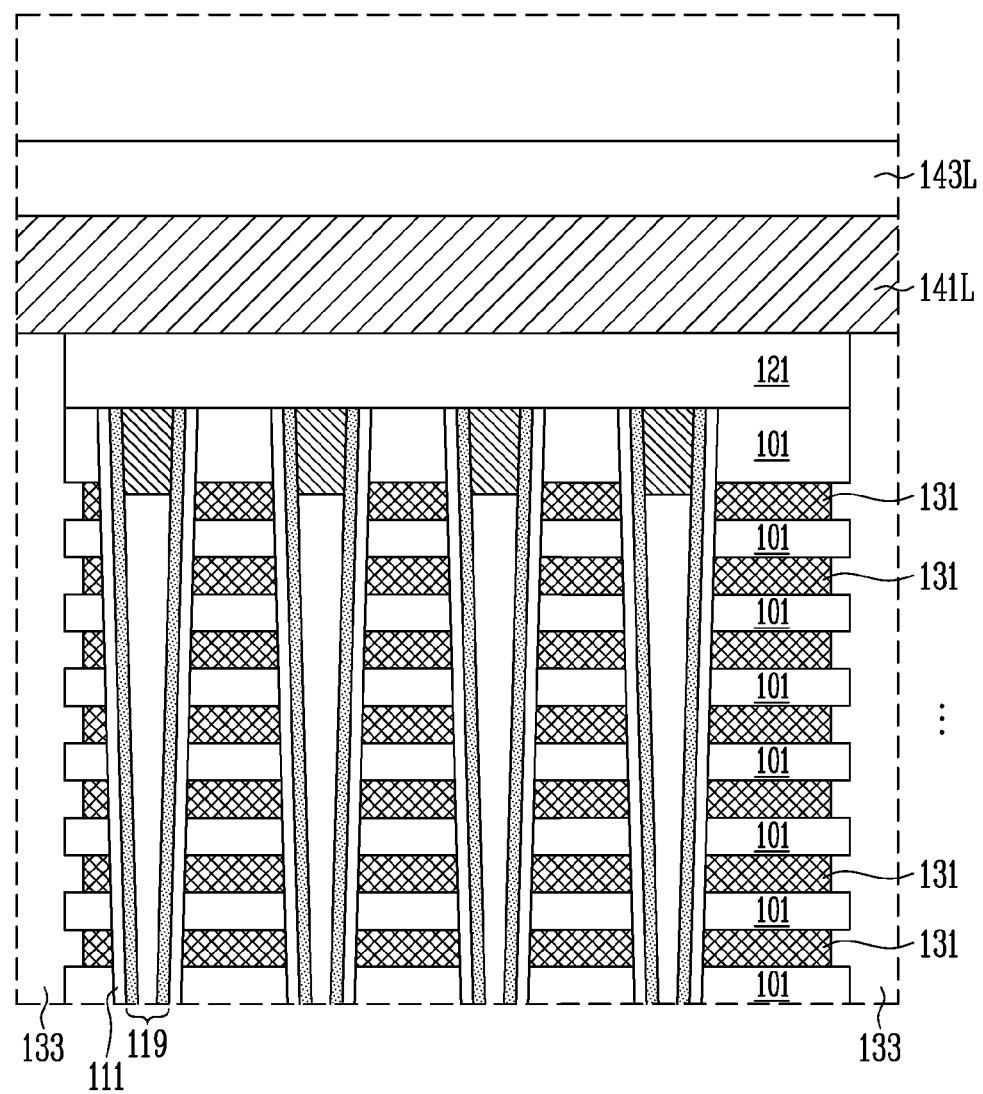
Figure 11D:
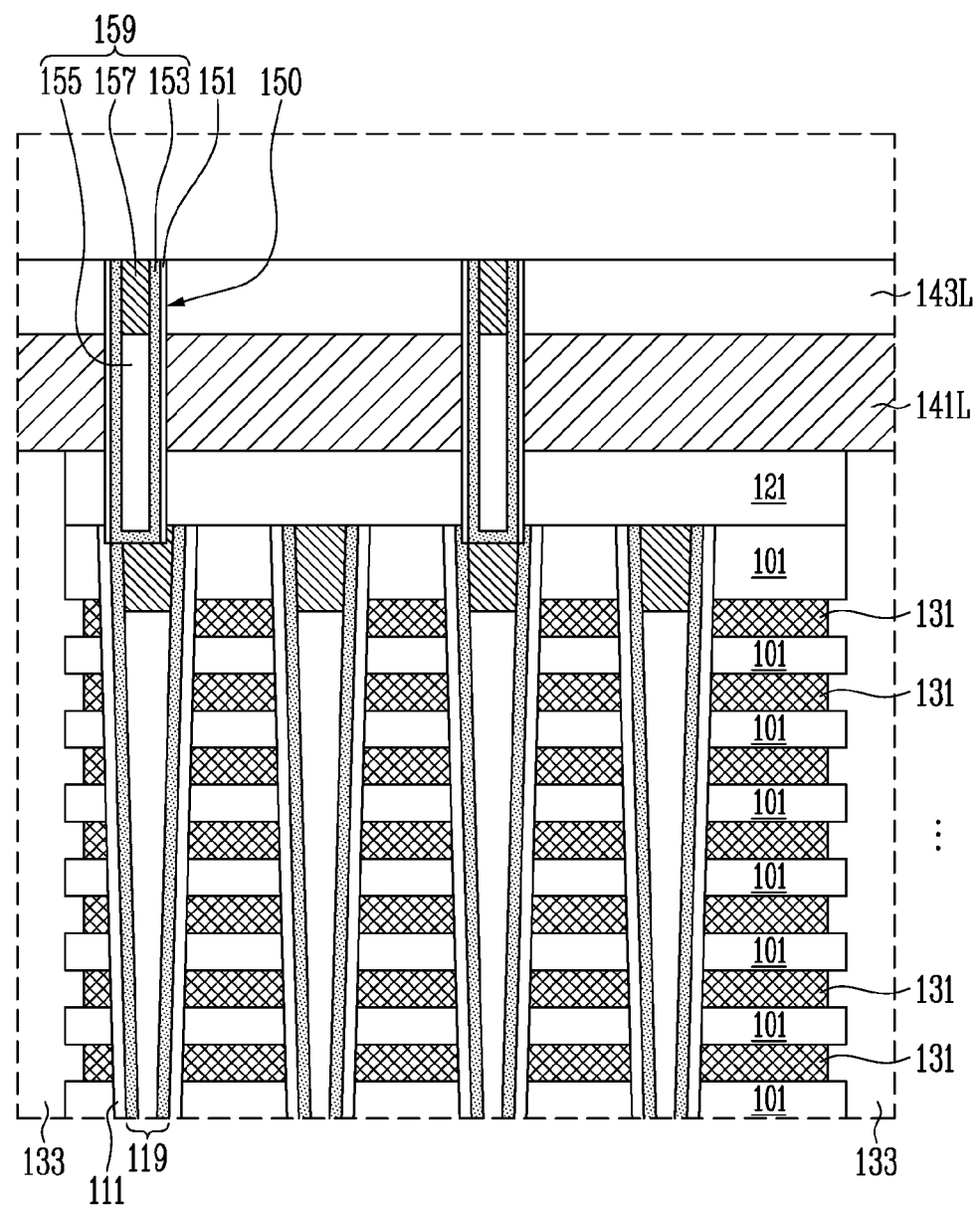
Figure 11E:
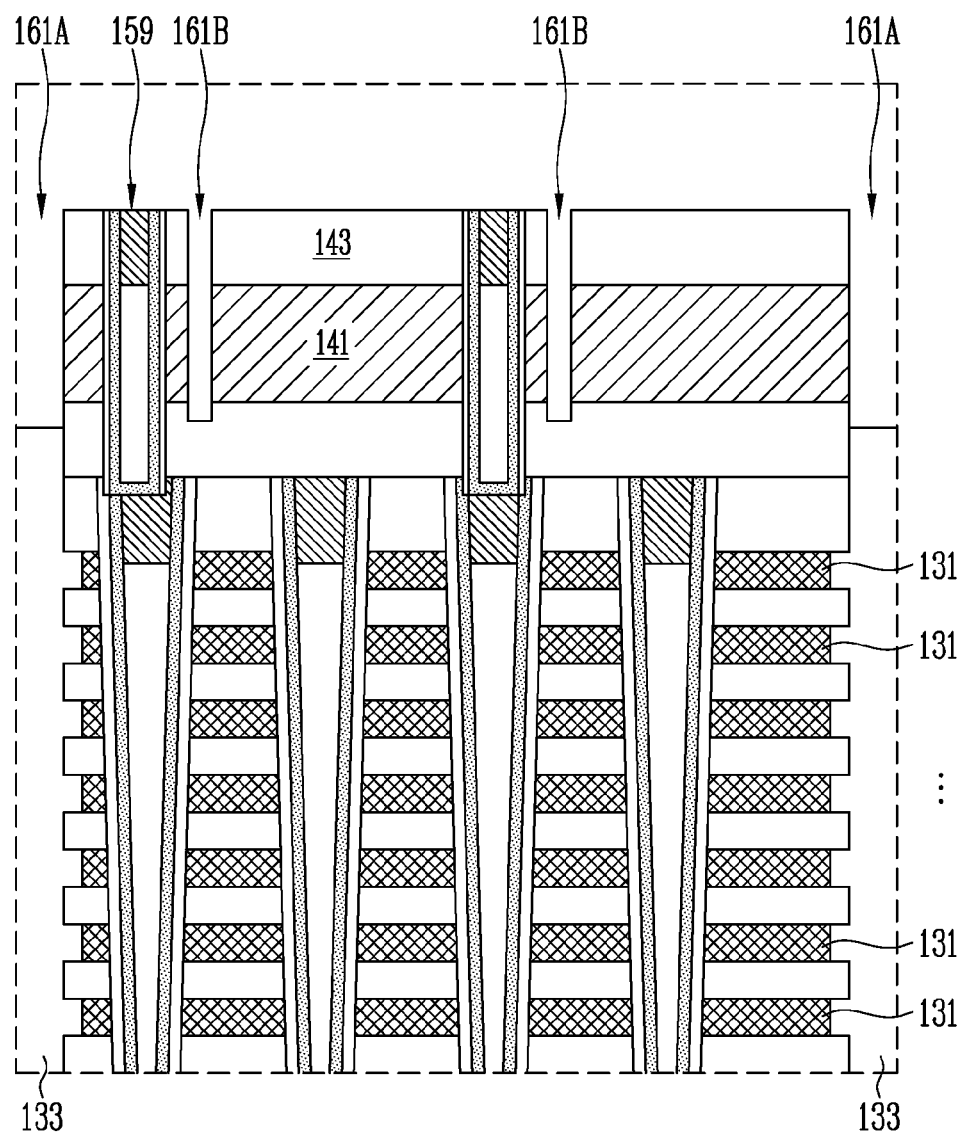
Figure 11F:
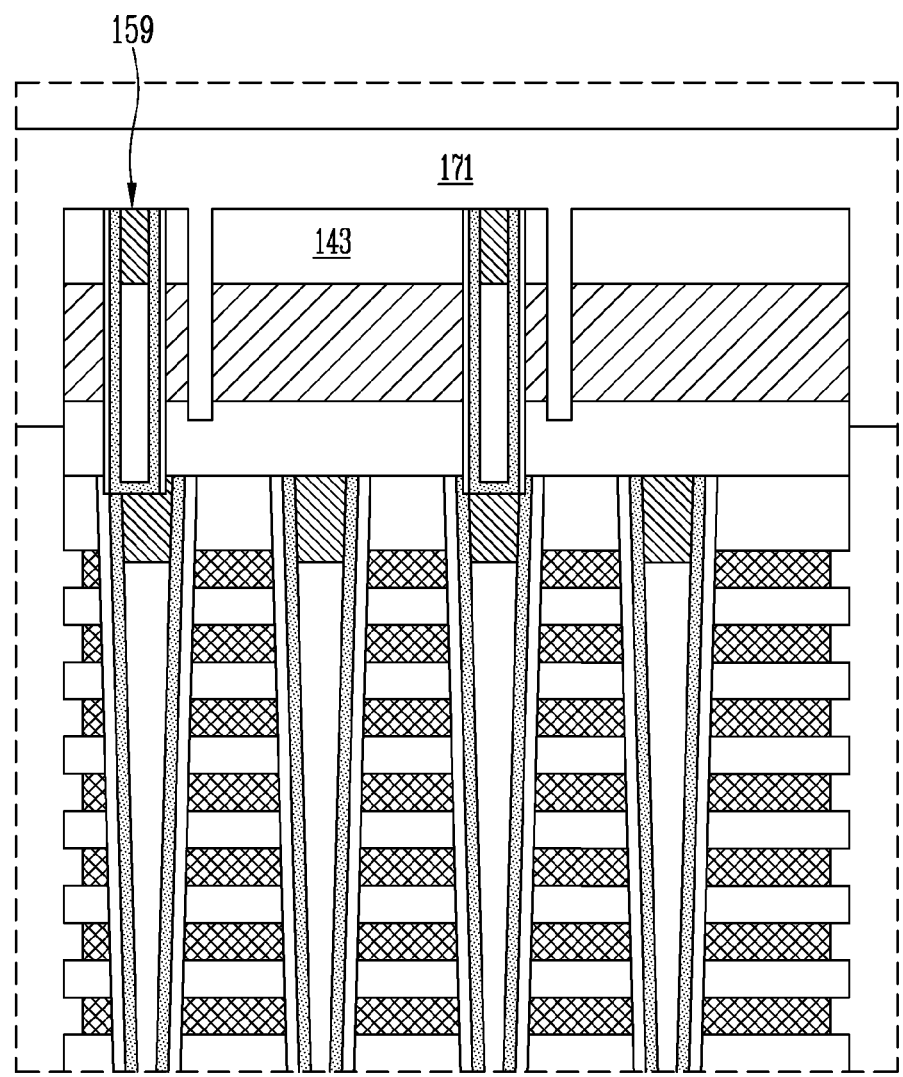
Figure 11G:
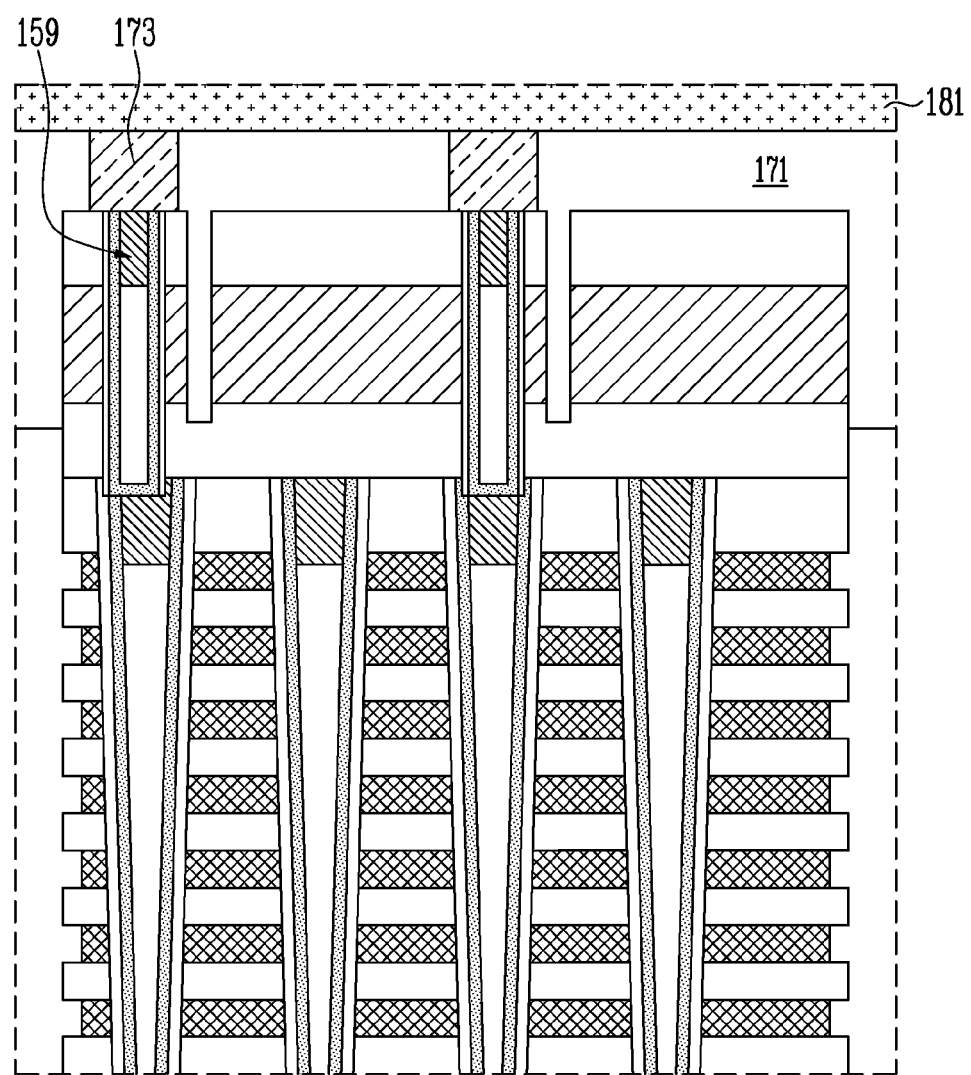

FIGS. 11A, 11B, 11C, 11D 11E, 11F, and 11G are sectional views illustrating a manufacturing method of a semiconductor memory device in accordance with an embodiment of the present disclosure. FIGS. 11A, 11B, 11C, 11D, and 11E are sectional views illustrating step of forming a gate stack structure, which is to be performed in the step S3 shown in FIG. 10A or the step S13 shown in FIG. 10B. FIGS. 11F and 11G are sectional views illustrating some of subsequent processes performed after the step of forming the gate stack structure.

In an embodiment, before the step of forming of the gate stack structure, a source layer for the source conductive pattern SL shown in FIG. 4 may be formed. In an embodiment, after a process shown in FIG. 11G, a source layer for the source conductive pattern SL shown in FIG. 5 may be formed.

Referring to FIG. 11A, the step of forming the gate stack structure may include step of alternately stacking first material layers 101 and the second material layers 103. Each of the first material layers 101 may include an insulating material for interlayer insulating layers, and each of the second material layers 103 may include a sacrificial material having an etch selectivity with respect to the first material layers 101. In an embodiment, the first material layers 101 may include silicon oxide, and the second material layers 103 may include silicon nitride.

The step of forming the gate stack structure may include step of forming first holes 110 penetrating the first material layers 101 and the second material layers 103.

The step of forming the gate stack structure may include step of forming channel structures 119 in the first holes 110.

The step of forming channel structures 119 may include step of forming a memory layer 111 on a sidewall of each of the first holes 110, step of forming a first channel layer 113 on the memory layer 111, step of forming a first core insulating layer 115 on the first channel layer 113, step of removing a portion of the first core insulating layer 115 such that an upper end of each of the first holes 110 is opened, and step of filling the opened upper end of each of the first holes 110 with a first capping pattern 117.

The memory layer 111 may include the blocking insulating layer BI, the data storage layer DL, and the tunnel insulating layer TI, which are shown in FIG. 9A. The step of forming the first channel layer 113 may include step of forming an undoped semiconductor layer. The step of removing a portion of the first core insulating layer 115 may be controlled such that a top surface of the first core insulating layer 115 is located at a level at which an uppermost layer among the second material layers 103 is located. The first capping pattern 117 may be formed of a doped semiconductor layer. In an embodiment, the first capping pattern 117 may include an n-type doped silicon layer.

Referring to FIG. 11B, the step of forming the gate stack structure may include step of forming a first insulating layer 121. The first insulating layer 121 may be formed to cover the channel structures 119.

The step of forming the gate stack structure may include step of forming first slits 123 penetrating the first insulating layer 121, the first material layers 101, and the second material layers 103 shown in FIG. 11A.

The step of forming the gate stack structure may include step of selectively removing the second material layers 103 shown in FIG. 11A through the first slits 123. Accordingly, horizontal spaces 125 may be defined between the first material layers 101.

Referring to FIG. 11C, the step of forming the gate stack structure may include step of forming plate electrodes 131 in the horizontal spaces 125 shown in FIG. 11B.

The step of forming the plate electrodes 131 may include step of forming a barrier metal layer on a surface of each of the horizontal spaces 125 shown in FIG. 11B, step of forming a metal layer filling the horizontal spaces 125 on the barrier metal layer, and step of removing the barrier metal layer and the metal layer from the inside of the first slits 123 shown in FIG. 11B.

Subsequently, a vertical structure 133 may be formed in each of the first slits 123 shown in FIG. 11B. In an embodiment, the vertical structure 133 may include a space insulating layer covering a sidewall of each of the first slits 123 and a vertical conductive pattern filling each of the first slits 123 on the space insulating layer. In an embodiment, the vertical structure 133 may include an insulating layer filling each of the first slits 123.

The step of forming the gate stack structure may include step of forming a conductive layer 141L on the first insulating layer 121 and step of forming a second insulating layer 143L on the conductive layer 141L. Although not shown in the drawing, before the conductive layer 141L is formed, an oxide layer extending to cover the vertical structure 133 and the first insulating layer 121 may be further formed on the first insulating layer 121.

Referring to FIG. 11D, the step of forming the gate stack structure may include step of forming second holes 150 exposing the channel structures 119. The second holes 150 may be formed by etching the first insulating layer 121, the conductive layer 141L, and the second insulating layer 143L.

The step of forming the gate stack structure may include step of forming drain-side channel structures 159 in the second holes 150. The step of forming the drain-side channel structures 159 may include step of forming a gate insulating layer 151 on a sidewall of each of the second holes 150, step of forming a second channel layer 153 on the gate insulating layer 151, step of forming a second core insulating layer 155 on the second channel layer 153, step of removing a portion of the second core insulating layer 155 such that an upper end of each of the second holes 150 is opened, and step of filling the opened upper end of each of the second holes 150 with a second capping pattern 157.

The step of forming the second channel layer 153 may include step of forming an undoped semiconductor layer. In the step of removing the portion of the second core insulating layer 153, an etching amount of the second core insulating layer 155 may be controlled by considering a depth to which the second capping pattern 157 is formed. In an embodiment, the step of removing the portion of the second core insulating layer 155 may be controlled such that a top surface of the second core insulating layer 155 is located at a level at which the conductive layer 141L is disposed. The second capping pattern 157 may be formed of a doped semiconductor layer. In an embodiment, the second capping pattern 157 may include an n-type doped silicon layer.

Although not shown in the drawing, in an embodiment, the step of forming the second channel layer 153 may include step of forming, on the gate insulating layer 151, the second capping pattern 157 which fills each of the second holes 150 and is in contact with the gate insulating layer 151.

Referring to FIG. 11E, the step of forming the gate stack structure may include step of forming second slits 161A and third slits 161B. The second slits 161A and the third slits 161B may be formed by etching the conductive layer 141L and the second insulating layer 143L, which are shown in FIG. 11D. The second slits 161A and the third slits 161B may be formed to completely penetrate the conductive layer 141L shown in FIG. 11D. The conductive layer 141L may be isolated into drain select lines 141 by the second slits 161A and the third slits 161B. The second insulating layer 143L may be isolated into insulating patterns 143 by the second slits 161A and the third slits 161B.

Each of the second slits 161A may overlap with the vertical structure 133. The third slits 161B may overlap with the plate electrodes 131.

Referring to FIG. 11F, an upper insulating layer 171 may be formed to cover the insulating patterns 143 and the drain-side channel structures 159. The upper insulating layer 171 may fill the second slits 161A and the third slits 16B, which are shown in FIG. 11E.

Referring to FIG. 11G, contact plugs 173 penetrating the upper insulating layer 171 may be formed. The contact plugs 173 may be connected to the drain-side channel structures 159. Subsequently, a bit line 181 connected to the contact plugs 173 may be formed. In accordance with an embodiment of the present disclosure, before the bit line 181 is formed, the first capping pattern 117 is formed as shown in FIG. 11A and the second capping pattern 157 is formed as shown in FIG. 11D. Accordingly, a dopant distribution range required to form a GIDL current during an erase operation may be stably controlled.

Figure 12:
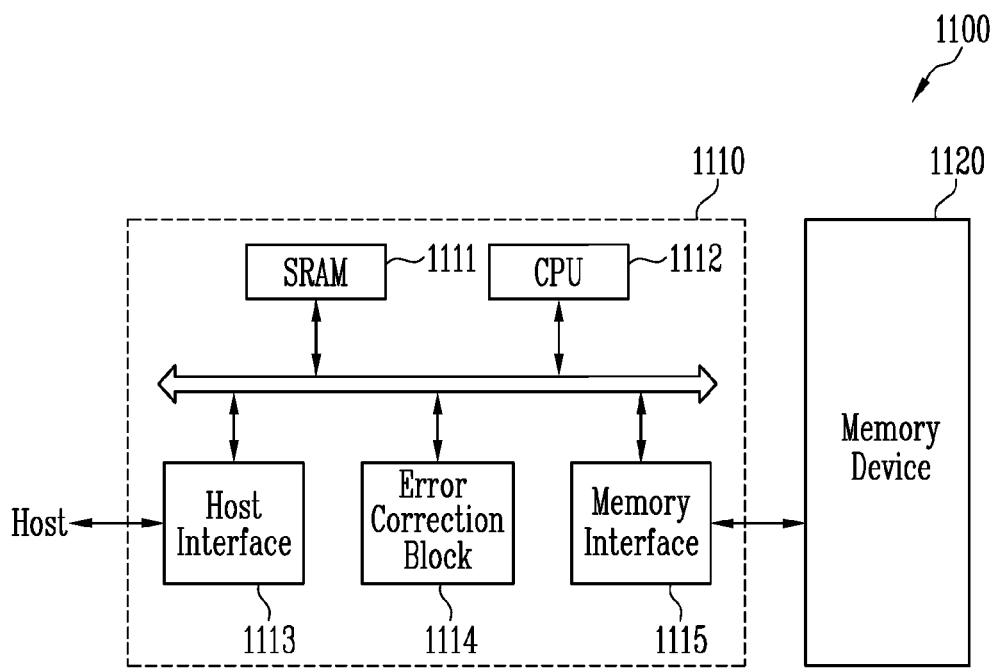
FIG. 12 is a block diagram illustrating a configuration of a memory system in accordance with an embodiment of the present disclosure.

FIG. 12 is a block diagram illustrating a configuration of a memory system in accordance with an embodiment of the present disclosure.

Referring to FIG. 12, the memory system 1100 includes a memory device 1120 and a memory controller 1110.

The memory device 1120 may include an erase control line disposed between a word line and drain select lines. The memory device 1120 may be a multi-chip package configured with a plurality of flash memory chips.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120, and the memory interface 1115 interfaces with the memory device 1120. In addition, the memory controller 1110 may further include a read only memory (ROM) for storing code data for interfacing with the host, and the like.

Figure 13:
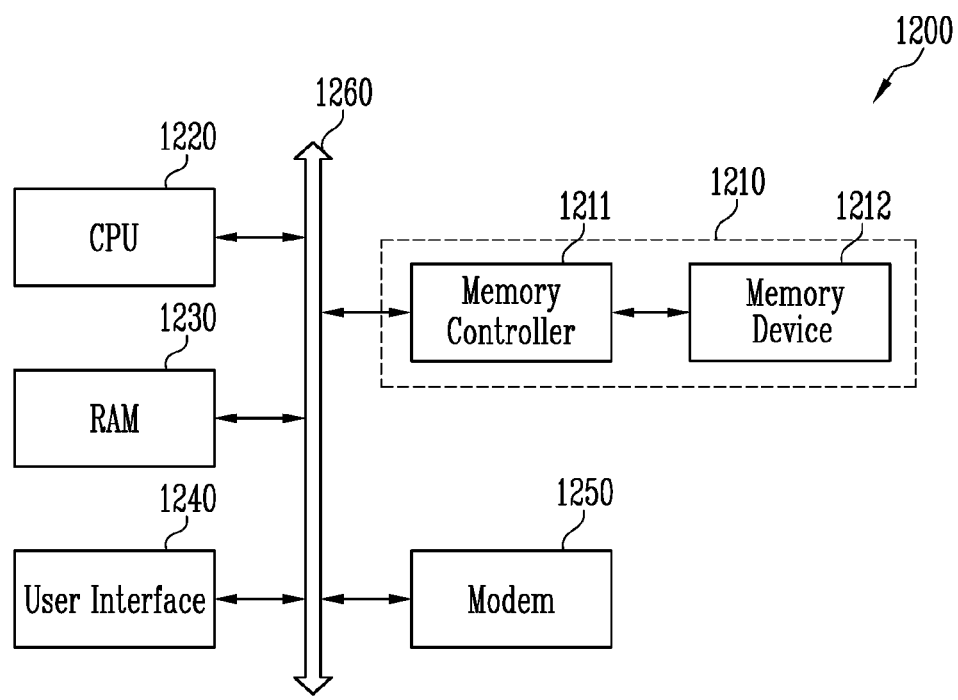
FIG. 13 is a block diagram illustrating a configuration of a computing system in accordance with an embodiment of the present disclosure.

FIG. 13 is a block diagram illustrating a configuration of a computing system in accordance with an embodiment of the present disclosure.

Referring to FIG. 13, the computing system 1200 may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may be configured with a memory device 1212 and a memory controller 1211 as described with reference to FIG. 12. The memory device 1212 may include an erase control line disposed between a word line and drain select lines.

In accordance with the present disclosure, an erase control line is disposed between a word line and a drain select line. In accordance with the present disclosure, the erase control line and the word line may be simultaneously patterned, so that a manufacturing process of the semiconductor memory device may be simplified.

In accordance with the present disclosure, the drain select line is disposed at a position at which a patterning process of the erase control line and the word line and a patterning process of the drain select line are performed while being distinguished from each other. Accordingly, a width of the drain select line may be formed different from that of each of the erase control line and the word line.

In accordance with the present disclosure, a channel structure penetrating the erase control line and the word line and a drain-side channel structure penetrating the drain select line are formed separately from each other. Accordingly, a variation can be reduced, in which a dopant distribution range in the channel structure and a dopant distribution range in the drain-side channel structure.

In accordance with the present disclosure, the dopant distribution range and the above-described variation in each of the channel structure and the drain-side channel structure may be stably controlled, and thus a Gate Induced Drain Leakage (GIDL) current can be stably generated at an upper end of the channel structure surrounded by the erase control line in an erase operation. Further, off-leakage current of a drain select transistor can be reduced, the drain select transistor defined at an intersection portion of the drain-side channel structure and the drain select line. As a result, the operational reliability of the semiconductor memory device can be improved.

What is claimed is:

1. A method for erasing a semiconductor memory device, the method comprising:

increasing a potential of a source conductive pattern by a potential of a bit line;

generating hot holes in an erase control transistor of a cell string and introducing the hot holes to a channel of a plurality of memory cells, wherein the cell string includes a source select transistor connected to the source conductive pattern, a drain select transistor connected to the bit line, the plurality of memory cells connected in series between the source select transistor and the drain select transistor, and the erase control transistor connected between the plurality of memory cells and the drain select transistor; and erasing data stored in the plurality of memory cells by applying an erase voltage to the bit line and applying an erase permission voltage to a plurality of word lines connected to the plurality of memory cells.

2. The method of claim 1, wherein the increasing of the potential of the source conductive pattern by the potential of the bit line includes applying a pre-erase voltage to the bit line at a first time, in a state in which the source conductive pattern is floated.

3. The method of claim 2, wherein the pre-erase voltage gradually increases from a start voltage level lower than the erase voltage to a level of the erase voltage.

4. The method of claim 2, wherein a drain select line connected to the drain select transistor and a source select line connected to the source select transistor are floated at a second time after the first time, wherein an erase control line connected to the erase control transistor is floated at a third time after the second time, wherein the second time and the third time are earlier than a time at which the erase voltage is applied.

5. The method of claim 4, wherein, before the second time, a voltage of 0V is applied to the drain select line and the source select line, wherein, before the third time, a voltage of 0V is applied to the erase control line.

6. The method of claim 2, wherein, while the pre-erase voltage is being applied, the word line is controlled in a floating state.

7. The method of claim 2, wherein the pre-erase voltage reaches the level of the erase voltage, before a time at which the erase permission voltage is applied to the plurality of word lines.

8. The method of claim 2, wherein the cell string further includes at least one of a drain-side dummy memory cell connected between the erase control transistor and the plurality of memory cells and a source-side dummy memory cell connected between the source select transistor and the plurality of memory cells.

9. The method of claim 8, wherein a drain select line connected to the drain select transistor and a source select line connected to the source select transistor are floated at a second time after the first time, wherein an erase control line connected to the erase control transistor is floated at a third time after the second time, wherein, when the cell string includes the drain-side dummy memory cell, a drain-side dummy word line connected to the drain-side dummy memory cell is floated at a fourth time after the third time, wherein the second time, the third time, and the fourth time are earlier than a time at which the erase voltage is applied.

10. The method of claim 8, wherein a drain select line connected to the drain select transistor and a source select line connected to the source select transistor are floated at a second time after the first time,
  wherein an erase control line connected to the erase control transistor is floated at a third time after the second time,
  wherein, when the cell string includes the source-side dummy memory cell, a source-side dummy word line connected to the source-side dummy memory cell is floated at a fourth time after the third time,
  wherein the second time, the third time, and the fourth time are earlier than a time at which the erase voltage is applied.

* * * * *